(12) United States Patent
Troyan

(10) Patent No.: US 9,865,811 B2
(45) Date of Patent: Jan. 9, 2018

(54) SEMICONDUCTOR MEMORY DEVICES FOR USE IN ELECTRICALLY ALTERABLE READ ONLY MEMORY (ROM) AND SEMICONDUCTOR THIN FILM DEVICES (SPINTRONS AND SPIN-ORBITRONS)

(71) Applicant: Eugeniy Troyan, Minsk (BY)

(72) Inventor: Eugeniy Troyan, Minsk (BY)

( * ) Notice: Subject to any disclaimer, the term of this patent is extended or adjusted under 35 U.S.C. 154(b) by 0 days.

(21) Appl. No.: 15/338,597

(22) Filed: Oct. 31, 2016

(65) Prior Publication Data

US 2017/0069839 A1 Mar. 9, 2017

Related U.S. Application Data

(63) Continuation-in-part of application No. 14/618,277, filed on Feb. 10, 2015, now abandoned.

(51) Int. Cl.
*H01L 45/00* (2006.01)
(52) U.S. Cl.
CPC .......... *H01L 45/1253* (2013.01); *H01L 45/06* (2013.01); *H01L 45/085* (2013.01); *H01L 45/12* (2013.01); *H01L 45/1206* (2013.01); *H01L 45/1233* (2013.01); *H01L 45/144* (2013.01)
(58) Field of Classification Search
CPC ... H01L 45/1253; H01L 45/06; H01L 45/085; H01L 45/12; H01L 45/1206; H01L 45/1233; H01L 45/144
See application file for complete search history.

(56) References Cited

U.S. PATENT DOCUMENTS

| | | | |
|---|---|---|---|
| 5,335,219 A | 8/1994 | Ovshinsky et al. | |
| 5,363,329 A | 11/1994 | Troyan | |
| 5,933,365 A | 8/1999 | Klersy et al. | |
| 6,072,716 A | 6/2000 | Jacobson et al. | |
| 6,992,369 B2 | 1/2006 | Kostylev et al. | |
| 7,754,603 B2 | 7/2010 | Ovshinsky | |
| 7,920,414 B2 | 4/2011 | Lowrey | |
| 7,977,674 B2 | 7/2011 | Yoon et al. | |
| 8,030,636 B2 * | 10/2011 | Liu ......................... H01L 45/06 257/2 |
| 8,064,247 B2 | 11/2011 | Lee et al. | |
| 8,228,719 B2 | 7/2012 | Lowrey | |

(Continued)

OTHER PUBLICATIONS

N.A. Fogel et al., "Interfacial superconductivity in semiconducting monochalcogenide superlattices", Phys. Rev. B 66, 2002, p. 174513 (1-11).

(Continued)

*Primary Examiner* — Walter H Swanson
(74) *Attorney, Agent, or Firm* — Polster Lieder

(57) ABSTRACT

An electrically alterable thin film memory device or non-volatile trigger which can be switched from a high resistance state to a low resistance state. The device increases the concentration of electrically active impurities at correspondent electrodes to which respect impurities would electro migrate during a large number of set-reset cycles. The device comprises a layered structure with memory layers formed on an interface of two regions as the result of the mutual mixing and migration of their constituents. One region contains an electrically active donor impurity. A thin layer of dielectric is placed in the other region. Each of the memory layers includes an interface of chalcogenide films.

15 Claims, 14 Drawing Sheets

(56) References Cited

U.S. PATENT DOCUMENTS

| | | | |
|---|---|---|---|
| 8,344,350 | B2 | 1/2013 | Czubatyj et al. |
| 8,363,248 | B2 | 1/2013 | Matsui et al. |
| 8,363,463 | B2 | 1/2013 | Shih et al. |
| 2009/0250679 | A1 | 10/2009 | Jung |
| 2010/0295011 | A1 | 11/2010 | Liu |

OTHER PUBLICATIONS

O.I. Yuzephovich et al., "Interfacial superconductivity in two-layer and multilater semiconductivity IV-VI heterostructures", Fiz. Niz. Temp., 2008, p. 1249-1258, V. 38, N.12.

H. Ji et al., "Bi2Te1.6S1.4 topological insulator in the tetradymite family", Phys. Rev., 2012, p. 201103 (1-5), B 66.

Khomitshy D.V. et al., "Edge states and topological properties of electrons on bismuth on silicon surface with giant spin-orbit coupling", JETF, 2014, pp. 525-534, V. 145, N.3.

Y.F. Nie et al., "Superconductivity and properties of FeTeOx films", J. Physc.Chem.Solids, 2011, pp. 426-429, V. 72.

J.D. Joannopoulos et al., "Electronic structure of trigonal and amorphous Se and Te", Physical Review B, Mar. 15, 1975, pp. 2186-2199, vol. 11, No. 6.

K.L.I. Kobayashi, et al., "Carrier-Concentration-Dependent Phase Transition in SnTe", Physical Review Letters, Sep. 20, 1976, pp. 772-774, vol. 37, No. 12.

Yu. V. Gulyaev, et al., "Electronic properties of nondegenerate strongly doped compensated semiconductors", Sov. Phys. JETP, American Institute of Physics, Oct. 1976, pp. 772-775, vol. 44, No. 4.

B.A. Volkov, et al., "Crystal structures and symmetry of the electron spectrum of IV-VI semiconductors", Sov. Phys. JETP, American Institute of Physics, Oct. 1978, pp. 687-696, vol. 48, No. 4.

D. Adler, et al., "Threshold switching in chalcogenide-glass thin films", J. Appl. Phys., American Institute of Physics, Jun. 1980, pp. 3289-3309, vol. 51, No. 6.

B.A. Volkov et al, "Jan-Teller Instability of Crystal Surroundings of Points Defects in A4B6 Semiconductors", Soy.Docl.Acad.Nauk, USSR, Fizika, V. 255, 1980, pp. 93-97.

V. Labunov, et al., "A Secondary Ion Mass Spectrometry Study of Two-Layer Systems Based on Tellurium", Thin Solid Films, 112, Elsevier Sequoia, 1984, pp. 81-88.

B.E. Bysmeücmep et al., 1985, vol. 539.2-537.220, pp. 459-491.

Shuichi Okano et al., "Chalcogenide Amorphous Semiconductor Diodes", Japanese Journal of Applied Physics, Jun. 1985, vol. 24, No. 6, pp. L445-L448.

Makoto Shiojiri et al., "Growth and Transformation of Cu—Te Crystals Produced by a Solid-Solid Reaction", Journal of Crystal Growth 83, Elsevier Science Publishers B.V., 1987, pp. 421-430, North-Holland, Amsterdam.

P.W. Anderson, "The Resonating Valence Bond State in La2CuO4 and Superconductivity", Science, vol. 235, pp. 1196-1198.

Junji Sunada et al., "UV-Photo Oxidation of Te Films (Photon Energy Dependence)", Applied Surface Science 33/34, Elsevier Science Publishers B.V., 1988, pp. 434-442, North-Holland, Amsterdam.

Makoto Shiojiri et al., "High-Resolution Electron Microscopy Observation of a Solid-Solid Reaction of Tellurium Films with Silver", Bull. Inst. Chem. Res., Kyoto Univ., 1989, vol. 66, No. 5, pp. 517-529.

Atsushi Ikawa et al., "Electronic and Lattice Structures of Isolated Se Chains and Defects in Them. II", Journal of the Physical Society of Japan, Mar. 1990, vol. 59, No. 3, pp. 1002-1016.

B.S. Kolosnitsin et al., "Structural Specifics and Electro-conductivity of Te films", Sov. Izv. Acad. Nauk, USSR, ser. "Neorg. Mater", 1991, vol. 27, No. 9, pp. 1820-1823.

A.I. Stetsun et al., "Infrared Absorption of Ag—and Cu—photodoped Chalcogenide Films", Journal of Non-Crystalline Solids 202, Elsevier Science B.V., 1996, pp. 113-121.

P.C. Texm et al., "Triangle Layered Structure Antiferromagnets with Homogenous field", 1997, vol. 111, No. 2, pp. 627-643.

Volcov et al., "Mixed Valence Impurities in Lead-Telluride based solid solutions", 2002, vol. 172, No. 8 (32 pages).

Bagraev et al, Selfcompensation Metastable Centres in Chalcogenides Semiconductors, 2002, vol. 44, No. 5, pp. 785-791.

M.A. Semina, et al, "Localization of Electron-Hole Complexes on Interface", 2006, vol. 40, No. 11, pp. 1373-1380.

Hans Lüth, "Solid Surfaces, Interfaces and Thin Films", Graduate Texts in Physics, Springer Heidelberg Dordrecht London New York, 2010, 586 pages.

Y.F. Nie et al, "Superconductivity Induced in Iron Telluride Films by Low-Temperature Oxygen Incorporation", Physical Review B 82, The American Physical Society, 2010, pp. 020508-1 to 020508-4.

Milos Krbal et al, "Crystalline GeTe-based phase-change alloys: Disorder in order", Physical Review B 86, American Physical Society, 2012, pp. 045212-1 to 045212-6.

* cited by examiner

SEMICONDUCTOR MEMORY DEVICES FOR USE IN ELECTRICALLY ALTERABLE READ ONLY MEMORY (ROM) AND SEMICONDUCTOR THIN FILM DEVICES (SPINTRONS AND SPIN-ORBITRONS)

CROSS REFERENCE TO RELATED APPLICATIONS

This application is a continuation-in-part (CIP) application claiming priority from U.S. patent application Ser. No. 14/618,277 filed Feb. 10, 2015, the disclosure of which is hereby incorporated by reference.

STATEMENT REGARDING FEDERALLY SPONSORED RESEARCH OR DEVELOPMENT

N/A

BACKGROUND OF THE INVENTION

This invention relates to semiconductor devices; and, more particularly, to semiconductor memory devices used in electrically alterable read only devices or ROMs, and semiconductor thin film devices or spintrons, or spin-orbitrons.

Approximately 60 years ago, the Russian scientist B. T. Kolomiyetz discovered semiconducting features in amorphous chalcogenide compounds. Kolomiyetz, using an external voltage in complex chalcogenide compounds such as AsTeJ, observed the effect of transmission from a high resistance state (OFF) to a low resistance state (ON). This effect was referred to as the effect of threshold switching.

Sometime after that, the American scientist S. R. Ovshinsky observed the effect of low-resistance state preservation after voltage removal in an amorphous chalcogenide compound GeTeSb. That effect was referred to as the effect of memory.

These discoveries served as an impetus for intensive development of a new research area; i.e., the physics of disordered chalcogenide semiconductors. Over time, switching effects were found in various complex chalcogenide compounds. However, of all the chalcogenide compounds with disordered structure having switching and memory effects, the two most distinctive compounds are SiTeAsGe (STAG) and GeTeSb (GTS). When an external voltage $(U=U_{th})$ is applied to amorphous glass $Si_{12}Te_{48}As_{30}Ge_{10}$, after a certain delay, one can observe an abrupt voltage drop such as is shown in FIG. 1 of the drawings. As further shown in FIG. 1, the specimen passes to an initial high resistance (OFF) state when the voltage drops to lower than $U_h$. The threshold switching effect on STAG compounds is both repeatable and reversible. This is why these compounds can be used as a part of electronic switches (keys).

Referring to FIG. 2, in amorphous compounds such as $Ge_2Te_5Sb_2$, the ON state persists even when there is no applied voltage. To convert the material to its initial OFF state, one energizes it using a high amplitude current impulse. The ON state memory effect in the specimen is repeatable and also reversible. Accordingly, the $Ge_2Te_5Sb_2$ compound can be successfully used in nonvolatile storage cell production.

Studies have shown that usage of different chalcogenide compounds leads to different results. Because of this, various models to explain the effects of memory and switching were proposed and these models are still widely used today. For instance, memory effects are connected, as a rule, to amorphous state crystallization, i.e. a thermal model; and electronic models are commonly used to explain the threshold switching effect. These models are still used despite of the fact that both the SiTeAsGe (STAG) and GeTeSb (GTS) compounds are amorphous.

Initially, the possibility of practical implementation of open switching effects in amorphous chalcogenide semiconductors universally aroused a great deal of interest. However, multiple attempts to create electronic devices on the basis of chalcogenide semiconductors have encountered many difficulties, the most important of which are their instability and unreliability. Many studies and experiments have shown that the effects of an abrupt resistance drop in amorphous chalcogenide semiconductors in a strong electric field are connected to phase transitions into a metastable state. Some examples of metastable states are described in U.S. Pat. No. 5,335,219. Issues related to the physical origin of these metastable states are still under consideration due to their complexity.

To find out more about the physical origin of these phenomena, it is first necessary to understand the characteristic features of chalcogenide semiconductors with a disordered structure. It is generally accepted that the main distinction between crystalline and non-crystalline semiconductors (those with a disordered structure and which are amorphous) is that non-crystalline semiconductors have many more structural defects than crystalline ones. In non-crystalline, amorphous chalcogenide semiconductors these defects are marked as valence-alternation pairs (V.A.P.): $C_3^+$-$C_1^-$, where C stands for a chalcogen atom. Further, the symbol at the base of the letter denotes a coordination number; that is, the number of bonds created with neighboring atoms, and the symbol at the top of the letter denotes a defect's charge.

Let me define some interesting and, to my mind, essential properties of these defects:

1. Driven by various external actions (electromagnetic field, heating, ultra-violet irradiation etc.) at these defects, a reversible redistribution of charge density occurs: $C_3^+$-$C_1^- \leftrightarrows C_3^0$. See, for example, the journal article "*Threshold switching in chalcogenide-glass thin films*", published in *J. Appl. Phys.*, vol. 51(6), p. 3289-3309, (1980), by D. Adler et. al. Redistribution of charge density occurs not only on chalcogen atoms but on other atoms included in the amorphous compound as well. This is induced by self-compensation processes, taking into account the dipole character of correlation between ions in chalcogenide compounds. The main principle of the process are described, for example, in the journal article "*Self-compensation of Metastable Centers in the Chalcogenide Semiconductor Glasses*", published in *Sov. Fiz. Tverd. Tela*, V. 22(5), P. 785-791 (2002) by N. T. Bagraev et. al.

2. $C_1^-$ is a negatively charged, singly coordinated chalcogen, or negative U-center. In this defect, two electrons are localized. The mechanism (model) of localization of two electrons was introduced by P. W. Anderson in his journal article "*Model for the Electronic Structure of Amorphous Semiconductors*", *Phys. Rev. Lett.*, V. 34, No. 15, p. 953-955, (1975). The pair of localized electrons on the negative U-center is, in essence, the analogue of Cooper's pair with small localization radius. Please refer to the Bagraev et al. article mentioned above.

Apart from the analysis of the defects features, it is also necessary to carry out an analysis of chalcogenide compounds. Percentage composition analysis of memory and switching elements on the basis of chalcogenide compounds elements demonstrates that the main chemical compound is Tellurium. Tellurium (Te) is a representative of chalcogenide material from column VI of the Periodic Table of the Elements. The structure of the valence shell of Te is $5s_25p_4$. Te is characterized by divalent bonding and the presence of lone pair (LP) electrons, the divalent bonding leading to the formation of chain structures. Two of four p-electrons form covalent bonds with neighboring atoms. The angle between atoms in the chain is 103.2°. The van der Waal's bonds between chains is not very strong. The last lone pair of electrons takes part in creation of these bonds. The crystalline structure of Te is hexagonal and anisotropic, and a high anisotropic crystalline structure is connected to the piezoelectric properties of Tellurium crystals.

Some time ago, I worked in the Academy of Sciences of the Belarusian Soviet Socialistic Republic on various projects and programs during which I carried out many comprehensive studies on thin solid Tellurium films and its alloys. In my research I obtained unusual and unexpected results. The most interesting and essential results obtained by me and other researchers are presented below.

Te films, produced using vacuum evaporation, have many lattice defects. Depending on the texture, which is defined by the deposition conditions of Te films (rate of the deposition, temperature of the substrate etc.), these defects are connected to broken covalence bonds and Van der Waal's bonds. The breaking of both the covalent and Van der Waal's bonds create levels in a Te band-gap. See the journal article "*Structural Features and Electro-conductivity of Te Thin Films*", published in *Sov. Izv. Acad. Nauk, USSR*, ser. "Neorg. Mater.", V. 27, No. 9, p. 1820-1825, (1991) by B. S. Kolosnitsin, E. F. Troyan et. al. For example, impairments of Van der Waal's bonds create states at the level of the upper edge of the valence band See "*Electronic structure of trigonal and amorphous Se and Te*", published in *Phys. Rev.*, B, V. 11, No. 6, p. 2186-2199 (1975) by J. D. Joanopoulos et. al., and the candidate's thesis by E. F. Troyan on the issue in 1997. Lattice defects in Te films act as acceptors, i.e. they attract electrons both from the valence band of Te and from various impurities or additives. As a rule those chemical elements have an electronegativity less than that of Te. Hence these films exhibit p-type conduction. However, some chemical elements with an electronegativity higher than Te become acceptors at certain states. These elements include Oxygen (O) and Fluorine (F) among others.

To effectively influence electro-physical parameters, additives in thin Te films are electrically active. There are many ways to achieve an electric activity in additives (impurities) in disordered chalcogenide semiconductors. These are referred to as modification processes of chalcogenide films. A technique of modification I employ involves increasing the activity of lattice defects in Te films. In the course of interaction with these defects, the additives (impurities) become electrically active. Each modification technique is important from the point of view of achieving switching effects in thin films on the base of chalcogenide disordered compounds.

Te films produced using vacuum evaporation have a relatively high electrical conductivity ($\sigma$), as Tellurium is a semiconductor with a narrow width forbidden band (energy gap or band gap); i.e., $E_g$=0.335 eV. The electrical conductivity $\sigma$ of Tellurium films depends on the conditions of the deposition and the conductivity $\sigma$ is measured with an accuracy of up to 3-120 $(\Omega cm)^{-1}$. If measured in a vacuum, one can observe a straight dependence of current (I) from voltage (V), i.e. the IV characteristic is a linear slope. Defects will weakly influence VAC properties with the only thing that changes being a slight variation in the slope of a linear plot of VAC. No plots with a negative differential resistance (NDR) S-type at VAC have been observed.

If certain metals e.g., Aluminum (Al), Silver (Ag) or Copper (Cu)) are used as electrodes, there may be changes in the resistance of the thin film structure. This indicates migration activity of some chemical elements in a Tellurium film. It is known that ion migration in metals leads to structural rearrangements of Te films. For instance, migration of Copper ions transforms Te hexagonal structure to orthorhombic, and then to a tetragonal structure. This process of transformation is described, for example, in the journal article "*Growth and Transformation of CuTe Crystals Produced by a Solid-Solid Reaction*", published in *J. Non-Crystal Sol.*, vol. 83, p. 421-430, (1987), by S. Makoto et. al. With Silver ions the transformation is to a monoclinic structure as described, for example, in the journal article "*High-resolution Electron Microscopy Observation of Solid-Solid Reaction of Tellurium Films with Silver*", published in *Bull. Inst. Chem. Res.*, Kyoto Univ., V. 66, N. 5, p. 517-529, (1989), by S. Makoto, et. al. Tellurium is a piezoelectric material in which elastic deformation (pulsing) occurs under the influence of external electrical fields. If one supposes that, as a result of ions (impurities) migration in Te films, internal electric fields are induced, such transformations can be related to the reversed piezoelectric effects in Tellurium.

Negative Differential Resistance (NDR) plots for the deviation from linearity in observed current voltage characteristics on VAC have been found to occur when an evaporation process of Te thin films was performed in two steps with an additional operation; i.e., filling of the vacuum chamber in which process occurred with a dry Oxygen ($O_2$) gas at a partial pressure on the order of $5.4 \times 10^{-3}$ Pa. It is well known that Oxygen molecules adsorbed at the films' surface and during interaction with various surface states will, as a rule, create oxides. Therefore, at the beginning of the studies to which this invention is related, it was supposed that, as a result of this additional operation, the following structure was formed: M1-Te1-O(Te)—Te2-Al (where, M1-Ni, Au, Cr; O(Te)—Te oxide; Al-aluminum).

For this reason, it was decided to more carefully study physical processes occurring in multiple layer structures: M1-Te1-O(Te)—Te2-Al and compare them with their electrical properties. It will be understood by those skilled in the art that all measurements were performed in a vacuum. As shown on the right side of FIG. 3*a*, immediately after producing such a structure VAC characteristics analogous to VAC were measured. Over a course of 1.5-2.0 hours, the total resistance of the thin film structure increased with the VAC characteristics then becoming analogous to that of a diode. This is as shown on the right side of FIG. 3*b*. Referring to the right side plot of FIG. 3*c*, in the first and third quadrants there are plots indicating NDR.

Next, the threshold switching voltage ($U_{th}$) was gradually increased. In the 24-28 hours after the structure was produced, a stabilization of electrical properties was observed with $U_{th}$=3.5-5V, with a high-resistivity for $R_{OFF}$ and a low-resistivity $R_{ON}$; i.e., $R_{OFF}/R_{ON}$ being on the order of $10^2$-$10^3$. It was further found that if Tellurium film was evaporated at a rate of deposition of $V_2$-10.0 nm/s, then the thin film structures switched as memory elements with $U_{th.1}$=4.5-5V and $R_{OFF}/R_{ON}$=$10^3$ (see FIG. 2), and at $V_1$=2.0 nm/s, as threshold switching elements with $U_{th.}$=3.5-4V and $R_{OFF}/R_{ON}10^2$-$10^3$ (see FIG. 1). When tellurium thin films were evaporated at a rate of deposition of $V_3$=5.0-6.0 nm/s, the inventor saw both memory effect and threshold switching effect in the same cell at the same time. It is particularly pointed out that at the same cell, the main distinctive feature of the effects observed is a significant difference in magnitude $R_{ON}$ of these states: i.e., $R_{ON}$ of the cell, which is in the threshold switching state, is significantly higher than $R_{ON}$ in memory cell.

Electrical reproduction of memory elements from a low resistance ON to a high resistance OFF state was achieved only with a change in polarity of the voltage applied to the electrodes. Threshold switching elements independently switched to the OFF state when the voltage on the electrodes was less than $U_h$ (Again see FIG. 1). And, memory elements were found to be very unstable in the ON state. It will be noted that both memory and threshold switching elements were defined and influenced by the threshold currents $I_{th}$ (see FIGS. 1 and 2) that define the temporal stability of the main electrical parameters including the number ($N_{switch}$) of switching cycles of the thin films structures. The lower the value of $I_{th.}$, the more stable and long lasting was the element. A characteristic feature of the structures produced was that they switched from the OFF to ON state only when there was a negative potential on the Aluminum electrode. Attempting to switch from the OFF to ON state, by supplying a positive potential on the Aluminum electrode, produced thin film structures at U>9-10V inevitably resulted in a break down.

Direct correlation between electrical parameters of the produced thin film structures and the polarity of the applied voltage places in question widely used switching effects models in chalcogenide semiconductors. Moreover, in production of memory and threshold switching cells, the same chemical elements were used. Only one technological parameter was changed; i.e., the deposition rate of Te thin films, and this resulted in different observed effects. For example, during production of memory cells, more high deposition rates were used; while, during production of threshold switching cells low deposition rates were used. Research on the structure of Te films has shown that in Te films produced at high deposition rates ($V_2 \geq 8.0$-$10.0$ nm/c and d$\geq$50 nm) defects of covalence bonds prevail. On the contrary, in films deposited at low deposition rates ($V_1$=2.0-3.0 nm/c and d$\leq$50 nm), defects in Van der Waal's bonds prevail.

Based upon the large amount of data obtained and results achieved in the course of studying these structures, a new model was worked out. The main ideas of this new model were introduced and implemented by the inventor in 1996. Since then, the inventor has been continuously working on his theory and has been able to update his model. Using data obtained after implementation of his new model in the production of switching elements has allowed the inventor to achieve new results that he forecasted earlier. The inventor also discovered that results obtained with his improved model can also be implemented in other applications.

A Phenomenological Model of Memory And Switching Effects in Thin Films Chalcogenide Devices The charts shown in FIGS. 3a-3c illustrate what happens in a thin film structure M1-Te1-0(Te)—Te2-Al (where M1-Ni, Au, Cr; O(Te)—Te oxide; Al-aluminum) at various stages of its production.

In FIG. 3a, the VAC at an initial stage of the formation of memory elements is shown. Here, the rate of the deposition of the Te film was $V_2$-8.0 nm/s. By filling the vacuum chamber where the structure is formed with a dry Oxygen gas between stages of Tellurium deposition (sputtering), one can artificially create a local inhomogeneity of potential in a thin film structure based upon Oxygen adsorption on the electric active surface states; i.e. it is a charged or "strong" form of chemisorption. In this regard, see the journal article "UV-Photo-oxidation of Te Films", published in Appl. Surf. Sci., V. 33/34, (1988), p. 434-442, by S. Junji et. al.

According to Volkenstein's theory of chemisorption ["Physical-Chemical Properties of Semiconductors' Surfaces", Nauka, Moscow, 1973, p. 340, F. F. Volkenstein] two forms of chemisorption exist: neutral (weak) and charged (strong). The "strongly" chemisorbed Oxygen molecules possess the properties of an acceptor; that is, they attract electrons from an absorbent material. Therefore, creation of adsorbed Oxygen on a Te film's surface leads to a change in the surface's charge. Oxygen acceptor impurities turn into negatively charged ions and enable creation of a negative surface charge. To compensate for the electrical field created by this charge, the number of majority carriers or holes increases. This process is accompanied by local band bending of the Te structure as indicated in the left side plot of FIG. 3a. For example, when Oxygen molecules are adsorbed on the Tellurium surface, the bands bend upward by approximately 0.15 eV. Oxygen ions on the surface of Te film deposited at, for example, $V_2$=8.0 nm/s now interact with electric active defect states represented by broken of covalent bonds (see FIG. 4). As a result, long resonance bonds are created which, as a rule, produce specific if molecular orbitals. In this regard, see the book "Solid Surfaces, Interfaces, and Thin Films", Springer, Berlin, Fifth Ed., p 577, 2012, Hans Luth, and the journal article "Effect of Resonance Bonding on the Properties of Crystalline and Amorphous Semiconductors", published in Phys. Rev. B, V. 8, No. 2, p. 660-667, (1973), by G. Lucovsky and R. M. White.

The effect of surface charge can be found in the course of migration processes in Te films with a metal electrode such as Aluminum. See, for example, SIMS Study Two-layer Systems Based on Tellurium", published in Thin Solid Films, v. 112, N1, p. 81-86, (1984), by V. A. Labynov et. al. It is known that in Te films Aluminum impurities demonstrate donor's properties, i.e. donate electrons and become positively charged ions $Al^{3+}$. See, for example, the journal article "Chalcogenide Amorphous Semiconductor Diodes," published in Jap. J. Appl. Phys., vol. 24, N. 6, p. L445-L448, (1985), by O. Shuichi et. al. In the course of migration, Aluminum ions interact with various electrically active defects in Te films. Initially this leads to the creation of specific resonance covalence bonds, and then to the creation of very weakly-bonding coordinative bonds. See, for example, "Infrared Absorption of Ag-and Cu-Photodoped Chalcogenide Films", published in J. Non-Crys. Sol., vol. 202, p. 113-121, (1996), by A. I. Stetsun et. al. As a result, $\pi^*$ molecular orbitals are created as well as weakly-bonding $\sigma_g^*{}_{(LP)}$ molecular orbitals. Under the lower edge of the conducting band in a semiconductor's band-gap, small (shallow) donor level $Al^{3+}$ and weak bond states (acceptor level $Al_1^{1+}$) are created near the upper edge of the valence band (i.e., near the LP zone). Migration process ions of Aluminum $Al^{3+}$ along the spiral chains correlate with defects of lone pair electrons belonging to the Te atoms. The reaction is described as:

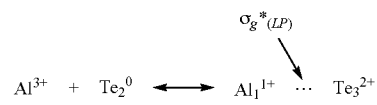

Due to the attraction of negative surface charge near an artificially created first local inhomogeneity, positively charged Aluminum ions accumulate, this creating a second inhomogeneity of potential. As shown in the left side plot of FIG. 3b, this leads to distortion of the Te zone structure. Due to local fluctuations of impurities concentration, as shown in the left side plot of FIGS. 3b and 3c, one can observe a large-scale fluctuation of the potentials at edges of the valence band and the conduction band, this being analogous to strongly doped compensated semiconductors. See "*Electronic Properties of Nondegenerate Strongly Doped Compensated Semiconductors*", published in *Sov. Phys. JETF*, Vol. 44, No 4, p. 772-775, (1976) by Yu. V. Gulyaev and V. P. Plesski. More and more non-degenerate free carriers are accumulated in deep potential wells. With the participation of adsorbed oxygen ions in exchange processes on active structural defects of a Te film's surface, first dipole clusters are created: $[Al^{3+}-2Te_3^{1-}O^{-2}]^{1-}$—$Al^{1+}$ with their "giant" dipole moment. This is as shown in FIG. 5. Some non-degenerate free carriers accumulated in the deep potential wells are localized on the attraction coulombic potential of the dipole clusters. See "*Localization of Electron-Hole Complexes on Interface Fluctuations of Quantum Wells*" published in *Fiz. Tverd. Tela*, V. 40 No. 11, p. 1373-1380 (2006) by M. A. Semina et. al. A decrease of the screening effect of non-degenerate gas of the free carriers on effective charges of impurities and defect complexes becomes evident as well. Lattice defects become more effective centers for ion trapping as hybridization of their bonds with impurities increases. Long resonance covalence bonds become shorter ($\pi^*$ transform into $\pi$-molecular orbitals). Consequently, donor levels of $Al^{3+}$ move to the middle of the band gap shown in the left side plot of FIG. 3c.

Ionized Aluminum impurities, by means of hybridization of bonds and coulombic interaction with the oppositely charged defects, are localized in the deep potential wells. Due to this, even reaching a critical impurity concentration of Aluminum in a second local area, so that $N=N_{cr.}$, in which $N_{cr.}^{-1/3} \ll r_0$, and $N_{cr.}^{-1/3} \gg a_B$, where $r_0$ is the screening radius and $a_B$ is the Bohr radius, quasi-metal conductivity is not observed in Te films.

Thus, increasing dipole concentrations facilitates an increase in the number of localized carriers concentrated in the deep potential wells. As a result, the total resistance of the structure rapidly increases. In addition, a further increase in the concentration of dipoles in Te films defects enhances the dipole-dipole interaction. Due to increasing dipoles concentration, the distance between dipoles decreases until a critical value $N_{cr}$ is reached. This value can be estimated using the Ginzburg-Levanyuk variable for the given substance, as is disclosed in "*Cooperative Processes in Crystals with Non-central Ions*", *USP. Fiz. Nauk* (*Sov. Phys. Usp.*) V. 146#3, p. 459-489, (1985) by B. E. Vugmeister and M. D. Glinchuc. The interaction between dipoles becomes cooperative leading to their mutual orientation and formation of a single dipole moment. The single dipole moment induces a sufficiently strong internal electric field ($E \approx 10^{6-7}$ V·cm) which causes elastic deformations and giant distortions of the hexagonal structure of Te films. This results in the hexagonal structure of Te films being transformed into a tetragonal or quasi-tetragonal structure. This process is referred to as structural self-regulation or self-organization. Referring to FIG. 6, the unit cell of the tetragonal structure can be described with four dipole clusters $[Al^{3+}-2Te_3^{1-}—O^{2-}]_4^{1-}$, elongated along the c-axis which coincides with the crystallographic c-axis. These negatively charged chains are bonded to each other with $Al^{1+}$ ions by means of specific coordinative $\sigma_{g(LP)}$ molecular orbitals. Initially these were essentially non-bonding $\sigma_g^*{}_{(LP)}$ molecular orbitals which are transformed to very specific $\sigma_{g(LP)}$ bonding orbitals, and thus create states in the valence zone. See "*Electronic and Lattice Structures of Isolated Se Chains and Defects in Them*", published in the *J. Phys. Soc. Jap.* V. 59, No. 3, p 1002-1016, (1990) by Atsushi Ikawa and F. Hideo.

These bonds stabilize the tetragonal structure formed with dipole clusters. The conduction and valence bands of the tetragonal structure are derived from the p-orbitals of Al and Te atoms, respectively. The band gap $E_g \approx 0.74$ eV, which exceeds more than twice the $E_g$ of Tellurium films ($E_{gTe}=0.335$ eV) is typical for the new structural formation.

Due to the self-organization process in the thin-film structure, except for band distortions, a sharp potential barrier is additionally formed. See FIG. 3c. The total resistance of the structure tends to infinity ($R_{str.} \Rightarrow \infty$); since, as $U \ll U_{th}$, there are almost no free carriers capable of overcoming this potential barrier. Therefore, as $U \ll U_{th}$, resistance of self-organized structures equals dozens of mΩhms. Increasing the voltage ($U \Rightarrow U_{th}$) allows some electrons and holes to release from the deep potential wells formed and overcome the potential barrier, and this is reflected in the volt-ampere characteristic nonlinearity as a sharp rise in current intensity. If subsequent increases in the external voltage do nothing to the structure, the volt-ampere characteristics would be that of a typical type diode. Many researchers, including the inventor, have observed no signs of NDR in volt-ampere characteristics when the frequency of the voltage applied to the switching structure exceeded $10^{7-8}$ Hz. This indicates that the processes occurring in the active material of the thin-filmed switches have little inertia and do not keep up with the variation of an applied external electric field. Inertia of the processes is stipulated by both the nature of the impurity ions electro-migration mechanisms under the influence of the external field, and by the nature of their interaction with Te thin films defects.

Using the example of impurity surface states, it can be shown that the mechanism of the processes in the active zone of thin film switching element occurs after achieving a voltage threshold $U=U_{th.1}$. This is as shown in FIGS. 7a and 7b.

To explain the essence of the process it should be noted, that under certain conditions in chalcogenide semiconductors, some ions become mobile as their chemical bonds are readily broken by an applied external electric field. Therefore chalcogenide semiconductors are classified among chalcogenide solid electrolytes. In this dipole complex are primarily ions having a larger charge which is located on the edges of the tetragonal structure. See FIG. 6. Ions with a lower charge are located in the tetragonal structure nodes and are less mobile due to the greater rigidity of bonds. Under the influence of an external electric field of a certain polarity, a sufficient number of non-degenerate free carriers will appear at these edges. Due to the increased screening of effective charge defect centers by non-degenerate gas free carriers, resonant bonds gets longer. Upon reaching $U=U_{th.1}$, the positively charged ions of Aluminum ($Al^{3+}$) and the negative ions of Oxygen ($O^2$) located on the edges of the tetragonal structure break the already less stable chemical bonds and are released from the dipole complex. See FIG. 7a. These ions electro migrate deeply into a Tellurium film at the edges of its octahedral voids. However, some $Al^{3+}$ ions (central ones) are shifted slightly because they are "stuck" in the tetrahedral voids and they maintain sufficient hybridization of the previously formed bonds. Central $Al^{3+}$ ions act as if "frozen" by a crystal field of tetrahedral symmetry.

However, due to the ion's electro-migration, the remaining ions in the complex of positive and negative charges become imbalanced. Also the coordination number of one of Tellurium ions changes as indicated in FIG. 7b. To restore electro-neutrality (charge balance) in the dipole complex when the value of the external field is high (U>$10^{5-6}$V/cm) and under the influence of a very powerful but very unstable internal field, an indirect exchange of Tellurium orbits' electrons there takes place so to redistribute the electron density on those remaining Aluminum ions of different valence. It should be noted that the emergence of a powerful internal field is conditioned by the interlayer polarization arising at the chalcogenide layers interface with a process of the ions electromigration. The reason for the instability of the internal field is discussed hereinbelow.

Thus, under the influence of a very powerful internal field of the interlayer polarization, three $Al^{1+}$ ions donate one electron each to produce an $Al^{3+}$ ion and this leads to the formation of three $Al^{2+}$ ions and one electro-neutral $Al^0$ atom. Such a valence change is energetically demanding and is a temperature-dependent process. The resulting electrically neutral $Al^0$ atom with completely filled orbitals is less mobile in external electric fields and is rigidly stabilized by the ligand field. Due to the restructuring of the ion-covalent bonds in the two remaining atoms in the cluster of Tellurium ions ($Te_1^{1-}$—$Te_3^{1-}$) and one Aluminum ion $Al^{2+}$, a new member of the metastable structure ($Al^{2+}$—$Te_3^{1-}$—$Te_1^{1-}$) is formed. Referring to FIG. 7b, this is a unit cell with bonding like $e_g(\pi)$, non-bonding like $\sigma_u^*{}_{(LP)}$ and antibonding like $\sigma^*$ molecular orbitals. In the new structural cluster formation the total amount of non-bonding like and antibonding like molecular orbitals equal the number of bonding like orbitals. This leads to the cells instability or metastability, in contrast to the original stable tetrahedral structure where the total number of bonding like orbitals exceeded the number non-bonding like ones. However, in FIG. 7b, it can be seen that such metastable clusters have dipole moments and these are ordered in one direction which opposes the direction of the external electric field.

One can suppose that after switching from the OFF state to the ON state, a narrow zone made of metastable clusters is formed in the active area of thin film cells where remanent internal polarization P2 (P1>P2) remains with a strictly directed polarization vector $P_{ins}$. The value of this vector is calculated as:

$$P_{ins} = -kU_h$$

where k is a proportionality coefficient related to the permittivity of the active material, and $U_h$ is the holding voltage of the element in the low resistance ON state (see FIG. 1). If the switching hypothesis is true, then these metastable clusters can be retained and fixed as structural formations at ambient temperature by not only the external field, but also by an internal field of the same (or greater) magnitude, but with the opposite vector. This is effect is referred to as fixed "induced polarization".

The inventor supposes this is the effect many researchers try to achieve when producing non-volatile memory elements, and is why one can state that Aluminum $Al^{3+}$ and Oxygen $O^{2-}$ ions electro-migrate over the octahedral voids under the influence of an external field and induce the creation of active material in layers surrounding these metastable clusters; i.e., the effect of stable-fixed ("frozen") polarization with $P_{ind.} \geq P_{ins}$. In this case one can observe the so-called memory effect on the chalcogenide thin film element. If, in the active material's layers surrounding these metastable clusters, certain (by value and direction) and stable-fixed polarization are not created, then during a decreasing external voltage, $U \leq U_h$, the intrinsic fields of these clusters will attract migrated and non-fixed Aluminum and Oxygen ions.

At the same time with the external voltage $U \leq U_h$, reverse redistribution of the electron density occurs on cationic elements, which leads to the break of degeneracy and the reconstruction of structural formation. This is responsible for the OFF state and means such thin film elements have a switching effect.

Appearance of spontaneous polarization and, consequently, internal fields at sufficient (critical) impurities' concentration is known. It has been widely studied in the context of such chalcogenide semiconductor compounds as GeTe and SnTe. See the journal article "*Crystal Structures and Symmetry of Electron Spectrum of IV-VI Semiconductors*", published in *Sov. Phys. JETP*, V. 48, No. 4, (1978), p. 687-696, by B. A. Volkov and O. A. Pankratov. In these semiconductor compounds, under certain conditions, one can observe ferroelectric phase transitions. To create necessary ferroelectric phase transitions, changes in the charge state of the impurities embedded in the defect structural formation $A^{IV}B^{VI}$ must occur. See, for example, "*Mixed Valence Impurities in Lead-Telluride Based Solutions*", *USP. Fiz. Nauk* (*Sov. Phys. Usp.*), V. 172, #8, p. 875-906, (2002), published by B. A. Volkov.

It is known that the change of a charge state of certain impurities in A creates Jan-Tellar local structural instability of $A^{IV}B^{VI}$ complexes due to anharmonicity of cubical potentials. See the journal article "*Jan-Tellar Instability of Crystal Surroundings of Point Defects in $A^4B^6$ Semiconductors*", *Sov. Docl. Acad. Nauk*, USSR, V. 255, p. 93-97, (1980), published by B. A. Volkov et al. Usually processes of transformation of the charge state of impurities in semiconductors are carried out during changes in temperatures, or under the influence of a powerful photon flux (e.g., electromagnetic laser radiation). It can be supposed that these changes in charge state take place probably under the influence of strong internal piezoelectric fields and external electric fields. Creation of strong internal piezoelectric fields can be connected to piezoelectric polarizations created at the edge of the filament's splitting with surrounding chalcogenide layers. For instance, in Te film creation, such a field is conditioned by "misfit" crystal lattice parameters of the two grids appearing at the interface of the filament of conductivity with the neighboring Te film. As previously noted, the grid's parameters of Te film are connected to the concentration of impurities electromigrating to the Te film under the influence of an external voltage.

It is interesting to note that the main chemical components of GeTe and SnTe are basic components of complex chalcogenide amorphous semiconductors which are used, as a rule, in the production of thin film memory elements. For example, the amorphous structure $Ge_2Sb_2Te_5$ (GTS) can be described as a mixture that is composed of the chaotic sequence of ferroelectric GeTe and $Sb_2Te_3$ components. The inventor supposes that it is an effect of the appearance of a fixed, induced polarized ferroelectric-like phase in thin GTS films, under the influence of strong electric fields that is one of the main preconditions necessary for the memory effect. On the basis of this physical model, one can understand and explain the differences in observed switching and memory effects in chalcogenide compounds such as STAG and GTS. In contrast with GTS, in STAG compounds it is hard to induce and preserve the necessary polarizing phase without an external electric field. Basically, it depends on differences in their features; i.e., the strength of created bonds between electrical migrating components and structural defects of such chalcogenide compounds as STAG and GTS. In his U.S. Pat. No. 7,754,603 B2, the inventor first introduced this idea based on the characteristic features of observed switching and memory effects in these chalcogenide compounds.

However, these preconditions are not enough for practical applications because the spontaneous ferroelectric phase created in such chalcogenide compounds as $A^{IV}B^{IV}$ with a necessary amount of covalence bond defects (non-saturated bonds) is not stable enough at ambient temperatures (T=−40°−+60° C.). It is known that this undesirable effect is related to the high concentration of free carriers in $A^{IV}B^{IV}$ compounds. See the journal article "*Carry Concentration Dependent Phase Transition in SnTe*" published in *Phys. Rev. Lett.*, V. 37, No. 12, p. 772-774, (1976), by K. L. Kabayashi et. al. Apparently the transition of thin film elements from an OFF state to an ON state is accompanied by the liberation of a high concentration of non-degenerate free carriers. Moreover, it is known that for the transition from an ON state to an OFF state, as a rule, short, high-amplitude current impulses are used. Consequently, a high concentration of free carriers is the main destabilizing factor of the ON state in memory elements. The inventor believes that this results from a large amount of long (weak, or "non-rigid") resonance bonds created during switching of memory elements to the ON state as described, for example, in "*Crystalline GeTe-based Phase-change Alloys: Disorder in order*", published in *Phys. Rev.*, B86, p. 045512(1)-045512(6), (2012), by M. Krbal et. al. Large amounts of long resonance bonds created during switching of memory elements to the ON state also leads to fluctuations in the concentration of high-mobility ions (migrating impurities) in chalcogenide films; and, in the inventor's opinion, is the main reason for induced polarization instability. Moreover, together with fluctuations in the concentration of high-mobility ions, interlayer polarization values change at the edge of the so called "filament" of conductivity and neighboring chalcogenide layers. As previous studies have shown, destabilizing properties of high concentration of non-degenerate free carriers in an active material surrounding the "filament" of conductivity appear in memory elements at the base of amorphous chalcogenide compounds, and these occur not only at the transition from an ON state to an OFF state. The destabilizing properties resulting from the high concentration of free carriers also has an essential negative impact during storage, and especially during the "reading" of information. This essentially makes the usage of chalcogenide cells, as an alternative to other elements of non-volatile memory, harder when produced, for instance, according to CMOS FLASH memory technology. The present invention solves an important problem of stabilization of a polarized phase in chalcogenide compounds without requiring an external voltage over a wide temperature range.

Other Relevant Important Results

Regarding the thin film structure at $U=U_{th}$, it was previously noted that four dipole clusters form an elementary cell of tetragonal structure. See FIG. 6. Restructuring of the tetragonal structure at $U=U_{th}$ is shown in FIGS. 8a and 8b. Referring to the latter, it will be noticed that during the transition from a tetragonal structure to a C6 structure (as in $MeTe_2$, where $Me^{2+}$ is a metal ion) under the influence of an internal field, a redistribution of electron density on Aluminum ions of various valences takes place, accompanied by the creation of degenerate (or quasi-degenerate) metastable states. Nontrivial quasi-degeneration of these metastable states results from the specificity of their interrelations with surrounding internal crystalline (lattice) fields of a hexagonal shape. From all possible planar and non-planar structures, 120° structures with a planar configuration of the spins have the least energy. See "*Triangle Layered Structure Antiferromagnets with Homogenous Field*", *Sov. JETF*, V. 111, No. 2, P. 627-643, (1997), by R. C. Gext and I. N. Bondarenko. This is why for the splitting of quasi-degeneracy resulting from the dynamic pseudo-Jan-Teller effect, a local rhombohedral distortion of tetragonal structure takes place as shown in FIG. 8b. This leads to a change in the surroundings of the central $Al^0$ atom. As a result, three molecular complexes $3(Al^{2+}\text{—}Te_3^{1-}\text{—}Te_1^{1-})$ group around one Aluminum atom $Al^0$. Again see FIG. 8b. Cationic elements $Al^{2+}$ are in a crystal octahedral ligand field, and an $Al^0$ atom is in the crystal ligand field, there being a tetrahedral symmetry. The effect of ligand fields on s and p Aluminum ion orbitals is equal and the splitting of levels in these structural complexes is absent. For this reason, splitting of quasi-degenerasy in these complexes happens only as the result of strong spin-orbit coupling (SOC) and local geometrical distortions which leads to creation of elementary cells $n(Al^{2+}\text{—}Te_3^{1-}\text{—}Te_1^{1-})$.

Referring to FIG. 9b, from these elementary cells a long charge-regulating super-lattice is created in the structural lattice of active material—"filament" of conductivity, the presence of which in the active material of thin film switchers has been shown in many previous experiments. Referring to FIG. 9a, a fragment of a 2D-equatorial plane of the "filament" of conductivity consisting of one elementary cell and three Aluminum ions from three neighboring elementary cells is shown. Because of the dynamical pseudo-Jan-Teller-effect in the 2D-equatorial plane, non-bonding molecular orbitals $\sigma_{u(LP)}$ become closer and overlap, despite Coulomb repulsion. Orbitals of localized electron pairs of neighboring three $Te_1^{1-}$ ions electrons, located over the 2D equatorial plane, are promoted. As a result of the promotion process, electron wave functions of ions overlap both in the anion and cationic sub-lattice of a new cluster structure. Anti-bonding molecular orbitals $\sigma^*$ are actively involved in this process. These molecular orbitals are formed and stabilized under the influence of an external field and are supported by the internal field. Anti-bonding molecular $\sigma^*$ orbitals allow for a tighter "squeeze" and for overlap of $Te_1^{1-}$ ion orbitals. This leads to the formation of bonding, nearly degenerate molecular orbitals, $e_g(\pi)$ representation, and consequently, to removal of the Anderson localization of electron pairs at the Fermi level. Due to superstructure ordering of anion elements (Tellurium ions) over the 2D equatorial plane, unified coherent states are created with the formation of a conductivity band ("gap") near the Fermi level. As a result, this process has to be accompanied by a Bose-condensation of two-dimensional Fermi-liquid in the "filament" of the layered chalcogenide material.

Conductivity in such a "filament" is defined by the distribution and interrelation of two waves: a) a wave of degenerated electron density (charge, or spin wave), sliding over the nodes, created over the equatorial plane, strictly ordered negatively charged Te ions' complexes→$n(Te_1^{1-}\text{—}Te_1^{1-}\text{—}Te_1^{1-}\text{—}Te_1^{1-})$; and b) a wave of quasi-localized electron density (or orbital wave), resonance tunneling over the ions' nodes in 2D-equatorial plane. Processes in the 2D equatorial plane are described using a RVB (resonating valence bond state) model. This is useful in explaining pseudo-Bose condensation of an electron gas at a pseudo-Fermi surface with the creation of a pseudo-gap under the upper edge or at the upper edge of a valence zone; i.e., the creation of a $\sigma_u$-zone from the mobile valence bond states (or the zone where the orbital order can be formed and stabilized). See "*The Resonating Valence Bond State in $La_2CuO_4$ and Superconductivity*" published in *Science*, V. 235, p. 1196-1198, (1987) by P. W. Anderson.

The minimal activation energy for orbital wave distribution in a 2D-equatorial plane is determined by the absence of covalence bonding of the anion state $Te_3^{1-}$ and the cation state $A^{2+}$.

However, such a physical scenario is not sufficiently complete since it is important to note that the "filament" of conductivity forming is an effect of bands inversion.

Simple estimates indicate that a scenario for producing the real effect (or pseudo-effect) of the bands inversion in the charge-regulating super lattice—"filament" of conductivity is quite likely. For example, as mentioned above, the conduction and valence bands of the tetragonal structure are primarily derived from p-orbitals of Al and Te atoms, respectively. In contrast, the orbitals in the band structure of the charge-regulating super lattice ("filament" of conductivity) are switched-over near the inversion points: the conduction band edge is derived from Te and the valence band edge is derived from Al.

There is a possibility of converting the normal isolator (OFF-state) into the 3D-topological crystalline one (ON-state) with application of an external voltage that shifts different energies and induces a specific band inversion. This leads to a nontrivial topological state on the interface films—"filament" of the conductivity with the Dirac semimetal phase. Within the physics of topological insulators, degenerate spin states should be separated and spin-polarized with strong spin-orbit coupling (SOC). The inventor presumes that the giant spin-orbit coupling is present in the ON-state of threshold switching material. As a result, due to the peculiarity of giant spin-orbit coupling with hybridization of the electron wave functions on band inversion points (like the Dirac points for TIs), the destructive interference effect of two waves is created. Or, stated differently, one can observe and measure the resistance of the ON state—$R_{ON}$ of the threshold switching elements. For example, when Al is used as an electrically active impurity during production of thin film threshold switching cells, resistance of the ON-state ($R_{ON}$) was quite significant: i.e., $R_{ON} \geq 10$ kOhm.

The physical picture is another for memory elements. The spatial inversion of the "filament" will reverse the direction of the polarization in ferroelectric order in neighbor Te layer (or in neighbor SnTe, GeTe layer as U.S. Pat. No. 5,363,329) making an effect to the spin-orbit coupling properties of the overall memory ON-state. The change of the polarization direction in neighbor layer, which is induced with phase transition, will reduce the strength of the spin-orbit coupling (SOC) in the Dirac semimetal phase state, thereby changing the band topology. The change of the polarization direction will assist also an inside field's balance which retain and fix metastable "filament" as structural formations at ambient temperature. One of the fields, which was originated with a breakage of the "filament" space-inversion symmetry, will disappear or will be significantly reduced in the memory ON-state. In the result:

1. It is obvious that if it is possible to reach un-screening effects in three-dimensional topological system, the decreasing SOC can create a real condition for the Dirac electrons helical-Cooper pairing in such a system at the ambient temperature. These degenerate spin states can be separated by a magnetic field only.

2. Due to SOC decreasing, the Dirac cone will be broken and the forbidden gap will be opened—so that the destructive interference will be reduced significantly. Hence the resistance of the ON state ($R_{ON}$) of the memory elements will be decrease sharply: $R_{ON} \ll 10$ kOhm.

The conductivity in "filament" of memory device also will be defined with a distribution of the two waves which constructively interact or can propagate without any destructive interaction. It is connected with a charge-Condo effect, when two-electron resonance backscattering from the degenerate impurities can be realized. Moreover, the similar effect can be observed in a structure, where we can get broken both space and time-reversal symmetry at the impurity. For example, if the magnetic orbital-degenerate impurity is present in the 2D equatorial plane of the 3D topological insulator, it can cause direct elastic backscattering of the orbital wave, thereby making a perfect transmission for the charge wave (degenerated electron density wave) at the Fermi level.

However, the high concentration of non-degenerate free carriers usually presents in the "filament" at ambient temperature, screening both a polarization phase in the neighbor layer and a Coulomb interaction between the ions that form the 2D equatorial plane, thereby collapsing the established orbital order in the "filament". Meanwhile, the impurity scattering cross section will be sharply decreased in the 2D plane that will influent essentially to a charge or to a spin density wave perfect transmission associated with gyrotropic order in the ON-state of the memory device, resulting in the creation of a "dirty" metal—degenerated semiconductor with a metallic type of conductivity.

The main characteristic of a "dirty" metal refers to an effect of incipient (weak) localization. Weak localization is a quantum-mechanical effect, where the electrons form standing waves by constructively interfering between two time-reversed trajectories after undergoing multiple scattering by phonons or defects, thereby giving rise to the resistivity at ambient temperature.

The inventor has found an original method to remove the non-degenerate free charged carriers in the memory elements ON-state that allows him to observe both superconductivity and magneto-resistive effects in some investigated structures at the room temperature.

Some time ago, the question was posed as to what would happen if other electrically active impurities instead of Aluminum were used for producing switching elements. Consider d-ions for example. In this regard, a search was undertaken for other electrically active impurities in order to study their impact on the main electrical parameters of thin film CHS-based structures. As a result of the search, unusual chemical elements were discovered. For example, when the rare earth element Yttrium (Y) was used in memory element production, a $R_{ON} \leq 9.58$ Ohm at 300° K. and $R_{ON} \approx 0$ Ohm at $T \leq 3.7°$ K. was achieved. When Lanthanum (La) was used, interesting magneto-resistive effects in the ON state were observed. For example, $R_{ON}$ was reversibly abruptly changed when turning the external longitudinal magnetic field switch on and off. These effects significantly expand the unique performance capabilities of disordered chalcogenide semiconductors. It is assumed that, over time, these interesting effects will be applied in various areas of electronics. These include areas such as high-temperature superconductivity, spintronics, and nano-electronics. For example, one can manufacture electronic circuits for use in quantum computing that have properties similar to conventional semiconductor devices, but on much smaller scales, and with substantially reduced power requirement and an extremely high speed of operation. The areas also include new electronic keys, extremely fast switches, electro-optical modulators, sensors, magnetic devices, magneto-resistive memory cells, energy saving cells for random-access memory (RAM) devices, and the like.

Other interesting results have been observed using the developed model which can be applied in practice. Beside these, using the model, one can readily explain the huge current density in the filament of conductivity, which can be more than $10^7$ A/cm$^2$, found on VAC at $U=U_{th}$ harmonic oscillations, diamagnetic, magnetic, high temperature superconductive and others exotic physics of chalcogenide semiconductors.

The developed model is not in its final form and requires further understanding and critical analysis. However, even now the model allows us to make some important original conclusions and proposed theses.

Referring to the above mentioned hypothesis one can conclude the following:

The filament of conductivity of memory elements is metastable and can remain in this state only if it is fixed, i.e., "frozen" by a certain value and directional vector associated with the internal electric field, and induced in surrounding layers of active material. This means the filament can remain in this metastable state for long periods of time if the value and direction of the surrounding field do not change. This is a very important parameter in defining the temporal stability of one of the two states of a memory element, particularly the highly conductive state or ON state.

Further, this feature is also highly connected to other important factors including:

a) the character of bonds created between migrating impurities and defects in the structural chalcogenide film lattice which surround the path of conductivity, i.e. with chemical compounds of the active material;

b) the stable concentration of an electrically active impurity in the lattice of active material surrounding the "filament" of conductivity;

c) the concentration of non-degenerate free carriers in the active material of the memory element allocated to the ON state.

Finally, thin film structures such as described, for example, in U.S. Pat. No. 5,363,329 are not sufficiently stable in a low resistance state or ON state and do not provide such new interesting effects as interfacial superconductivity and interfacial magnetization (a spin transistor effect) in semiconducting chalcogenide superlattices. However, despite this insufficiency, the thin film structures described in this patent have one advantage with respect to standard memory elements produced on the basis of amorphous chalcogenide semiconductors. Switching effects in the memory elements described in the patent depend on the polarity of an applied external voltage on the element's electrodes, i.e. switching from OFF to ON is carried out only for a certain polarity of the applied voltage. To switch a memory element to OFF, one needs to change the polarity of the voltage applied to its electrodes. The significance of this is that by means of a certain sequence of the operations occurring in the active area of a memory cell, as earlier described, a dipole layer having a foreseeable polarization vector is created.

Further in accordance with principles derived in accordance with the patent, a dipole layer with a predetermined polarization vector is created using, along an inter-electrode current path of memory elements, zones with varying concentration profiles for additives (donors and acceptors); these zones being separated by a narrow active region forming the memory layer. Also, it was preferable to use one interface of a chalcogenide film Te—SnTe and Te—GeTe as the memory layer. Accordingly, the U.S. Pat. No. 5,363,329 was directed toward the making of a layered structure in which a layer of Tellurium with an appropriate concentration of electrically active donor impurities (Aluminum (Al), Antimony (Sb), Indium (In), Gallium (Ga), Copper (Cu) and others) was placed between the switching layer and one of the electrodes. A layer of chalcogenide embodiment SnTe or GeTe including a thin layer of dielectric was placed between the switching layer and another electrode. A layer of dielectric containing Oxygen or Fluorine was necessary for the creation of a dipole layer consisting of interacting dipoles on the interface of films Te—SnTe or Te—GeTe. This dipole layer is created at the expense of the Coloumb interaction with negatively charged impurities in the SnTe or GeTe film with positively charged donor impurities in the Tellurium film. When the concentration of electrically active impurities in the interfaces of chalcogenide films Te—SnTe and Te—GeTe are critical, dipole-dipole interaction of a cooperative character will result. These conditions are necessary, as was mentioned above, for the development of the memory effect.

The inventor is not aware of other works focused on the mechanisms and methods of influence on the value of free carriers' concentration in the ON state of active material in thin film memory elements, it being understood that researchers and scientists continue to focus on the search of new chemical compositions for the active layers. The inventor, however, believes he has developed a new and unique solution to this problem.

BRIEF SUMMARY OF THE INVENTION

It is thus an object of the present invention to provide an improved semiconductor chalcogenide memory device.

It is another object of the present invention to provide an improved semiconductor chalcogenide memory device which facilitates the implementation of interfacial superconductivity and spin current polarization in the hetero-structure interface of chalcogenide films at room temperature.

In accordance with principles of the present invention it is preferable to use two interfaces of chalcogenide films Te—SnTe and Te—GeTe as memory layers. Thus, this invention is directed toward making a layered structure in which a Tellurium layer (central area) with an appropriate concentration of electrically active donor impurities is placed between lower and upper memory layers. Material for first or second offset electrodes that have contacts with the Tellurium layer (central area) are another source of electrically active donor impurities. Two layers of a chalcogenide alloy, SnTe or GeTe with Sn and Te (Ge and Te) in a ratio of approximately 1:1, with a fitted thin layer of dielectric, is placed between the memory layers and the bottom or the upper electrodes. The dielectric layers are used as additives in both chalcogenide alloys. The layers of dielectric containing Oxygen or Fluorine are necessary for the creation of two dipole layers consisting of interacting dipoles on the interface of the Te—SnTe or Te—GeTe films. These dipole layers are created at the expense of the Coloumb interaction negatively charged impurities in the SnTe or GeTe alloy with positively charged donor impurities in the Tellurium layer (central area). When the concentration of electrically active impurities in the interfaces of chalcogenide films Te—SnTe and Te—GeTe are critical, dipole-dipole interaction of a cooperative character will result. These conditions are necessary for the development of memory effects on the interfaces of chalcogenide films.

Therefore, in accordance with the present invention, in one embodiment, a memory device includes three or four terminals in electrical communication with chalcogenide layers where a lower memory layer can be switched from a high resistance state (OFF) to a low resistance state (ON) between one pair of terminals upon application of a threshold voltage between the terminals; but where the upper memory layer can be switched from a low resistance ON state to a high resistance OFF state between different pairs of terminals.

Further, it is important to note the polarity dependence of the memory device of the invention. Switching the memory device to a low resistance ON state occurs at the beginning of a negative voltage pulse of appropriate amplitude and duration ($U_{th1}$) applied to the first offset electrode contacting the Tellurium layer (central area). This signal is applied between the first offset electrode and the bottom electrode. Simultaneously, a negative voltage pulse of corresponding amplitude and duration ($U_{th2}$) is applied to the upper electrode. This signal is applied between upper and bottom electrodes that are in contact with the chalcogenide alloys (materials). The result of this operation is that after switching the lower memory layer of memory device into the low resistance ON state, the upper memory layer of memory device immediately switches to a high resistance OFF state. After switching the memory device into the ON state, the metastable state of the lower memory layer is held by at least two stable internal electric fields:

1) an oppositely directed stable field of the ferroelectric phase induced in the nearest zone to it (Field 1); and
2) an oppositely directed stable field (Field 2) of the dipole phase created at the time of the upper memory layer switching to a resistive OFF-state).

Ferroelectric phase stability in the nearest zone of the lower memory layer switched to the ON state is characterized by an almost total absence of free carriers the majority of which are localized near upper memory layer. This results in a device having improved stability in impedance in a lower resistance state during set/reset cycling.

The device is restored to its high resistance state OFF state at the beginning of a negative voltage pulse of appropriate amplitude and duration ($U_{th1}$) being applied to the first offset electrode that contacts the Tellurium layer (central area). This signal is applied between the first offset electrode and the upper electrodes. Simultaneously, a negative voltage pulse also of a corresponding amplitude and duration ($U_{th2}$) is applied to the lower electrode. This signal is applied between lower and upper electrodes that contact the chalcogenide alloys.

Next, another embodiment of the invention comprises a memory device having three or four terminals in electrical communication with chalcogenide layers. Here, to achieve interfacial superconductive and spin effects in semiconducting chalcogenide superlattices, one uses earth rare chemical elements including, but not limited to, Y (Yttrium) and La (Lanthanum) as electrically active impurities (i.e., additives) in Te films. Other chemical elements are also used for this purpose. I have found that one can use CuO (or $BaCuO_2$) and MnO, accordingly, as oxides in SnTe or GeTe alloys. Other more complex oxides can also be used for this purpose.

Other objects and features will be in part apparent and in part pointed out hereinafter.

BRIEF DESCRIPTION OF THE SEVERAL VIEWS OF THE DRAWINGS

The accompanying figures, which together with detailed description which follows, form part of the specification and illustrate the various embodiments described in the specification.

FIGS. 3a-3c are zone diagrams of a Al—Te1-O(Te)—Te2-Me structure at various stages of its production wherein FIG. 3a is immediately after Oxygen lapping to a vacuum chamber; FIG. 3b is an intermediate stage illustrating Al migration and formation of a first dipole $[Al^{3+}-2Te^{1-}O^{2-}]^{1-}$—$Al^{1+}$; and FIG. 3c illustrates a final stage including the joining of dipoles to one dipole complex and the formation of a gigantic cluster: $\{[Al^{3+}-2Te^{1-}O^{2-}]^{1-}-Al^{1+}\}_n$. For each FIG. 3a-3c, on the right side of each figure is a zone diagram in which IV curves are shown, these characterizing each stage of formation of the thin film structure.

FIGS. 7a and 7b illustrate creation of a metastable structure at $U=U_{th.1}$ wherein FIG. 7a illustrates one dipole cluster, and FIG. 7b the elementary cell of the metastable structure n($Al^{2+}$—$Te_2^{1-}$—$Te_1^{1-}$). In these figures, P1 and P2 represent dipole moments of the metastable structure.

Corresponding reference characters indicate corresponding parts throughout the several views of the drawings.

DETAILED DESCRIPTION OF INVENTION

Figure 1:
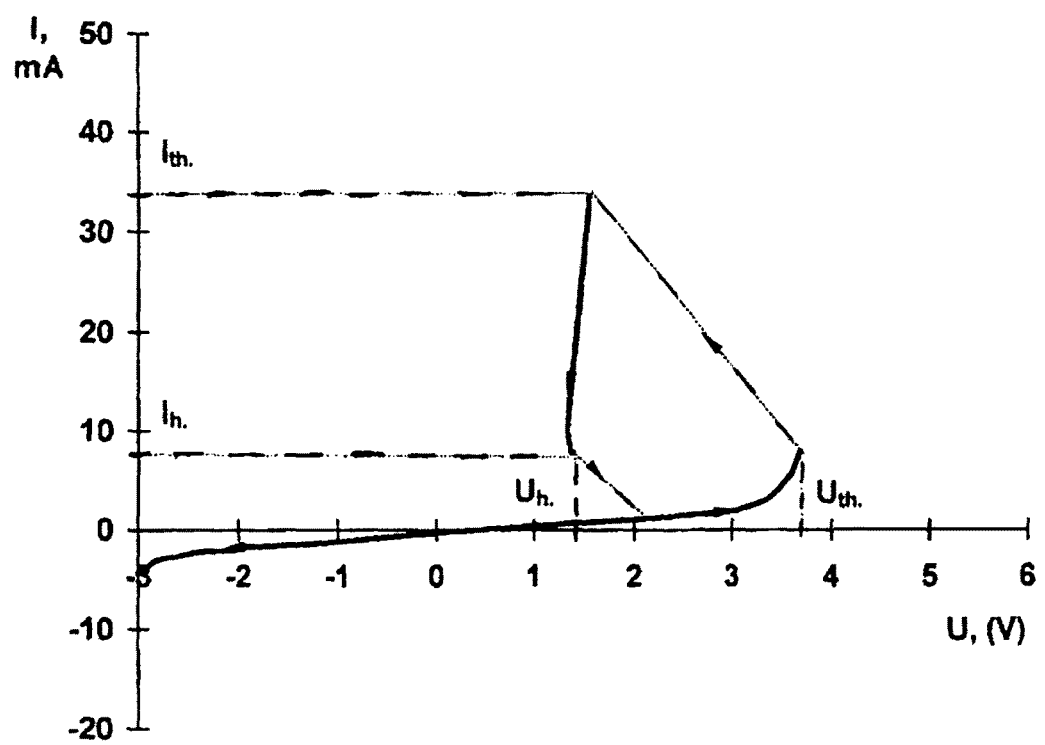
FIG. 1 illustrates current-voltage (IV) characteristics of threshold elements.
Figure 2:
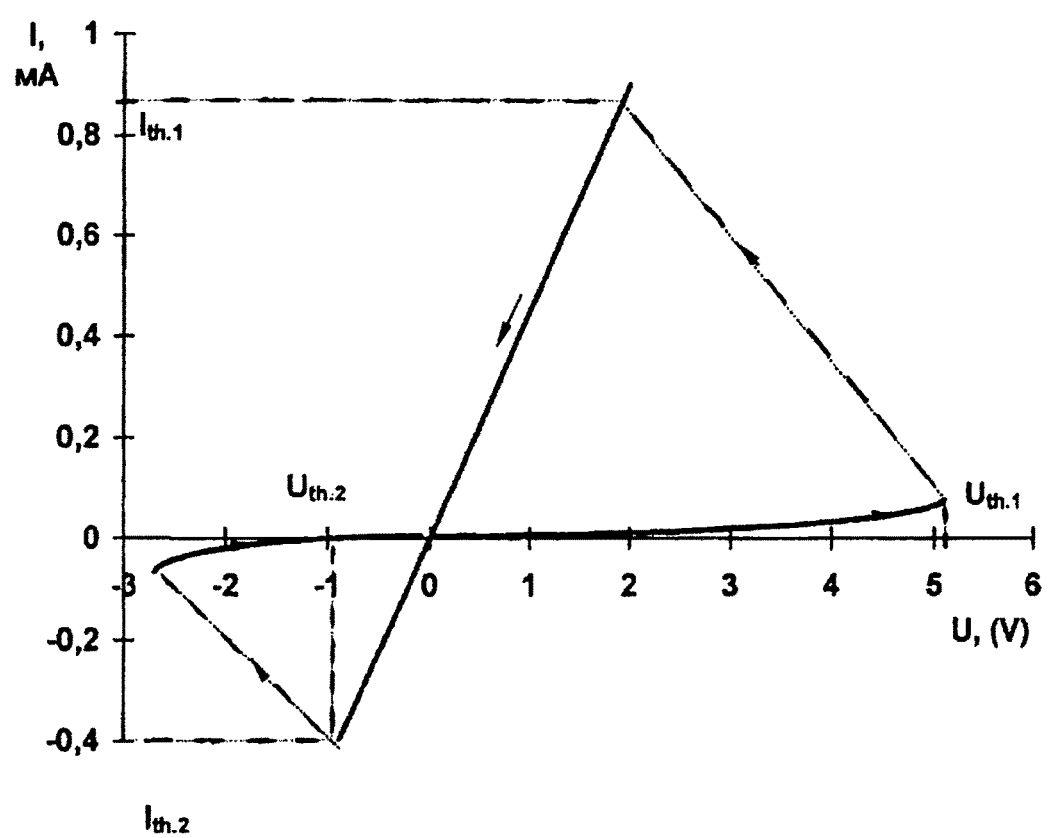
FIG. 2 illustrates current-voltage (IV) characteristics of memory elements.
Figure 3A:
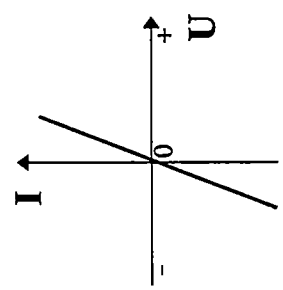
Figure 3A:
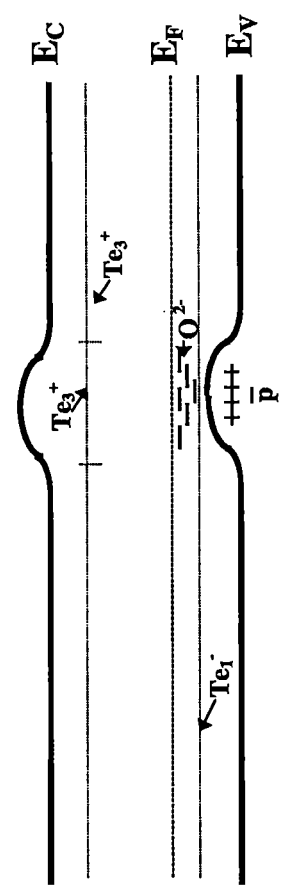
Figure 3B:
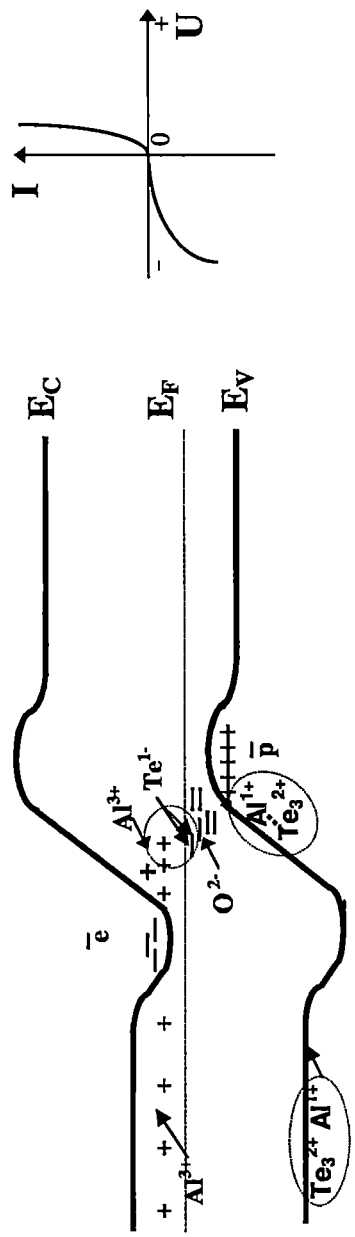
Figure 3C:
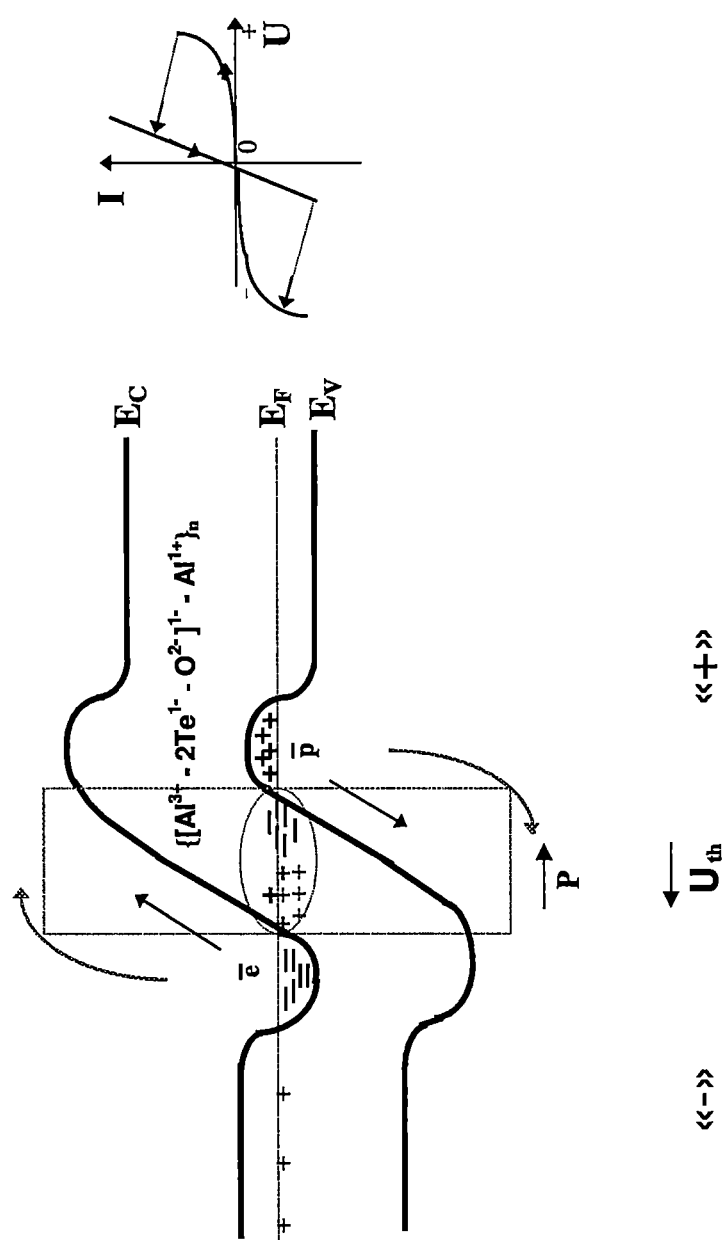
Figure 4:
FIG. 4 is a reproduction of an electron microphotograph of a Te film (200 nm thick) vacuum-deposited on an Aluminum film coated glass substrate at room temperature, V=8.0 nm/c (×50 000).
Figure 5:
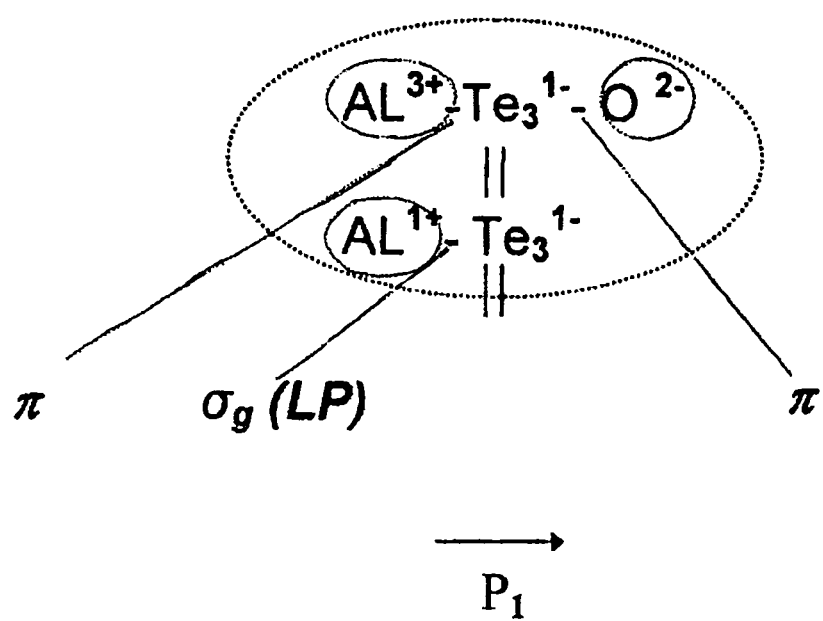
FIG. 5 represents the formation of dipole clusters at surface states.
Figure 6:
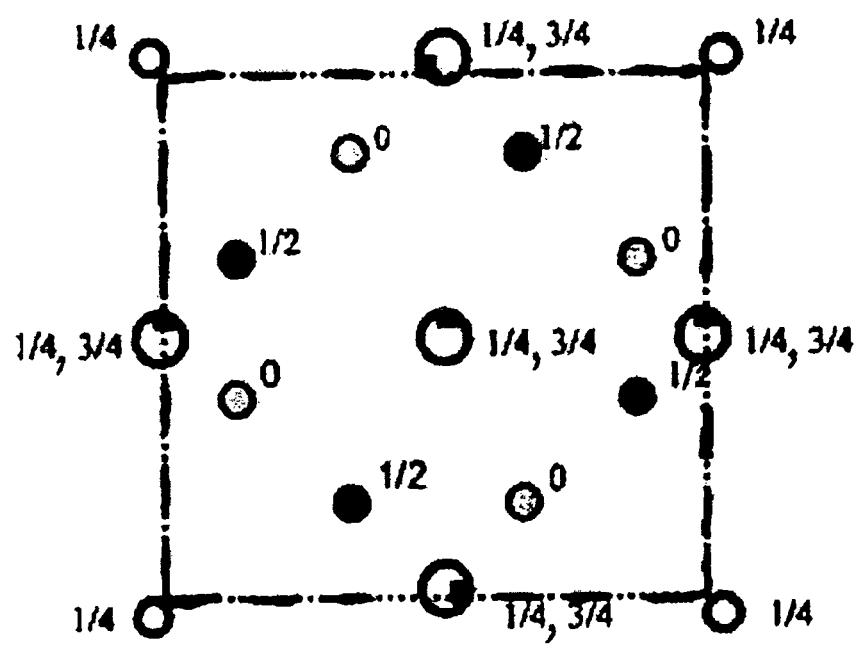
FIG. 6 represents the projection of a single cell of a tetragonal structure in the plane (001) where O—$O^{2-}$, ■—$Al^{3+}$; ○—$Al^{1+}$; ●—$Te_3^{1-}$ ☉-$Te_3^{-}$. The numbers indicate respective heights above the plane.
Figure 7B:
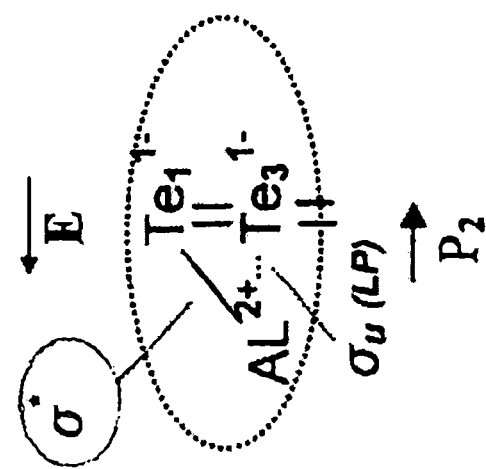
Figure 7A:
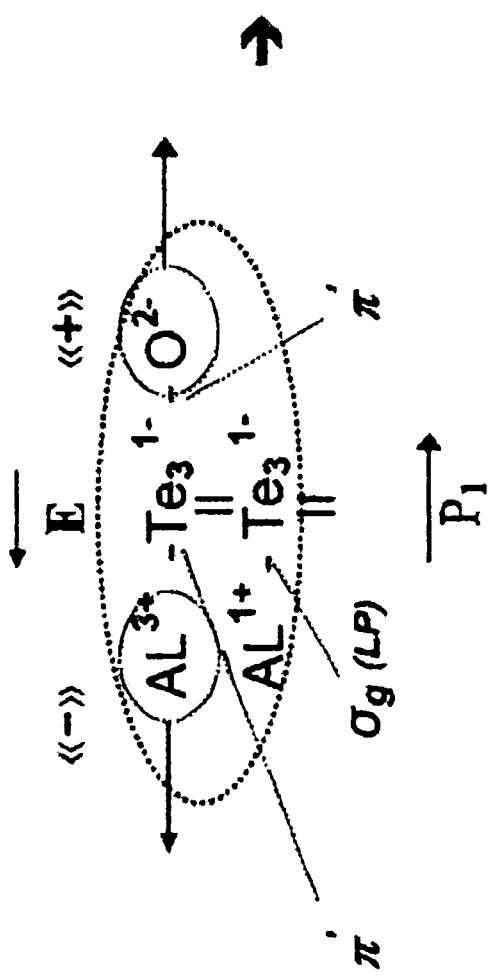
Figure 8B:
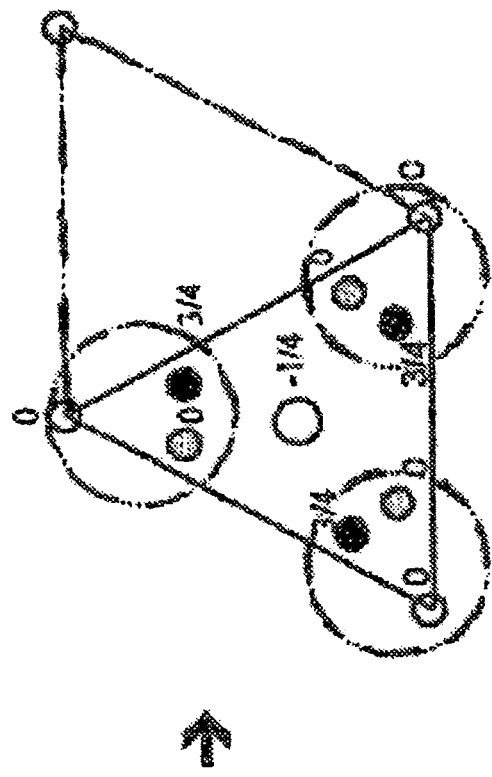
FIG. 8b shows the transformation of a single cell of a tetragonal structure to a metastable structure $\{Al^{2+}(Mn^{2+})$—$Te_3^{1-}$—$Te_1^{1-}\}$ of C6-type at $U=U_{th.1}$, O—$Al^0(La^0)$; ○—$Al^{2+}(Mn^{2+})$; ●-$Te_1^{1-}$ ☉-$Te_3^{1-}$.
Figure 8A:
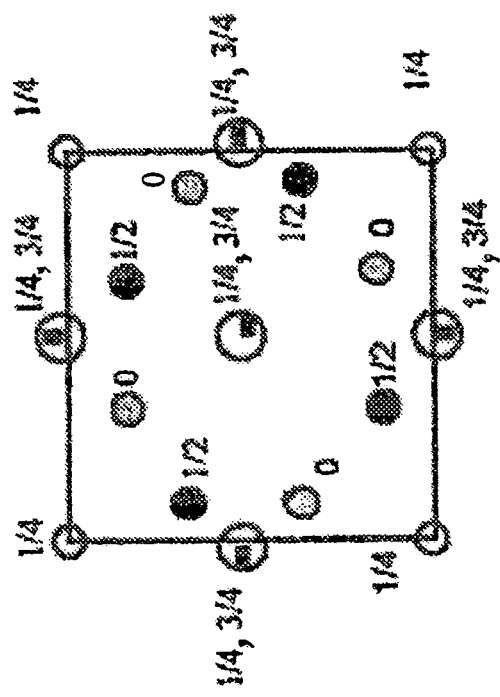
FIG. 8a again represents the projection of a single cell of a tetragonal structure in the plane (001) with the numbers again indicating heights above this plane, and where O—$O^{2-}$, ■—$Al^{3+}$(La3+); ○—$Al^{1+}$($Mn^{1+}$); ●—$Te_3^{1-}$; ☉$e_3^{1-}$.
Figure 9B:
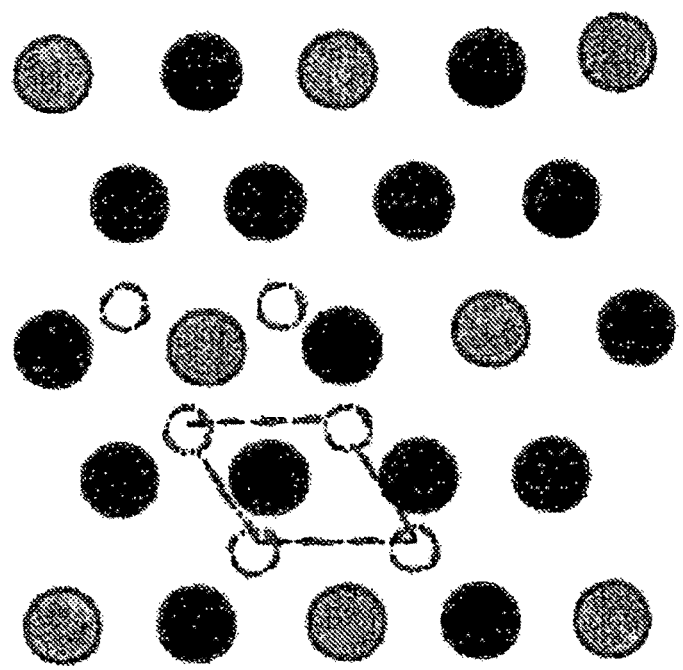
FIG. 9b represents a 2D-equatorial plane of the system under consideration with Te ions chains n($Te_1^{1-}$—$Te_1^{1-}$—$Te_1^{-}$—$Te_1^{1-}$) located above the system. The dashed lines outline a fragment of a distorted octahedron created by Te ions ($Te_1^{1-}$) above the 2D-equatorial plane.
Figure 9A:
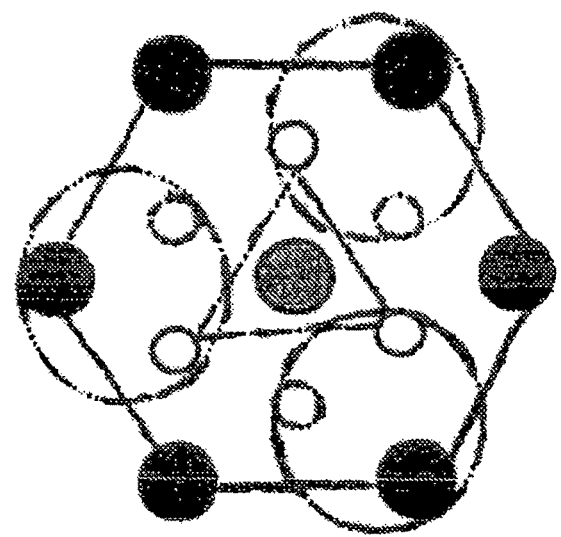
FIG. 9a represents a fragment of a microcrystal current filament created by a single cell and which includes $3(Al^{2+}$—$Te_3^{1-}$—$Te_1^{1-})$—$Al^0$ and three Al ions ($Al^{2+}$) from three neighboring elementary cells. The circular dashed lines illustrate molecular groups ($Al^{2+}$—$Te_3^{1}$—$Te_1^{1-}$). Atoms of Al ions $Al^{2+}$ are represented by the black circles and Te atoms as dashed line white circles. Solid line white circles depict Te ions located in the equatorial plane and the dashed lines extending between the solid line white circles are above the 2D one. Grey circles represent Al atoms $Al^0$.

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the invention is not limited in its application to the details of construction and the arrangement of components set forth in the following description or illustrated in the drawings. The invention is capable of other embodiments and of being practiced or carried out in various ways. Also, it will be understood that the phraseology and terminology used herein is for the purpose of description and should not be regarded as limiting.

As indicated above, the present invention employs an interface of inorganic films functioning as a memory material layer. A metastable super lattice with the remanent polarization is formed in this interface. In particular, and in accordance with the invention, it is proposed to use as interface chalcogenide films: Te—SnTe or Te—GeTe. However, the present invention may employ other semiconductor materials, as desired.

Figure 10:
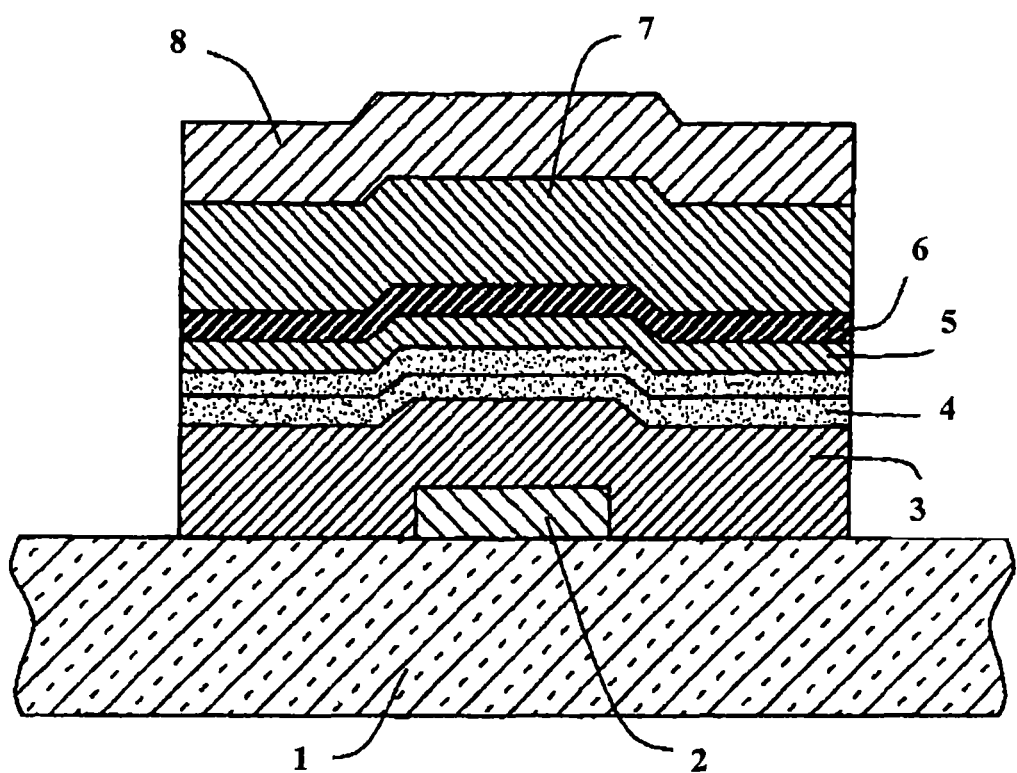
FIG. 10 represents an enlarged cross-section of a prior art memory device.

A prior art memory device using such semiconductor materials is illustrated in FIG. 10. As shown therein, the memory device is formed on an insulator layer 1 which may or may not be a semiconductor substrate. A conductor 2 is first formed on insulator layer 1 and is, for example, Molybdenum (Mo). A Tellurium layer 3 having an appropriate concentration of electrically active donor impurities such as, for example, Aluminum (Al), is deposited on conductor 2. On the top of layer 3, a Germanium-Tellurium or Tin-Tellurium semiconductor layer 5, with a proportion of the respective constituents being 1:1, is deposited. A feature of this prior art memory device is that when forming memory material layer 4, no additional technological operations are required. Rather, memory material layer 4 is formed on the interface of layers 3 and 5 by a mutual diffusion and mixing of constituents. On the top of layer 5, a layer 6 of a dielectric material is deposited. Above dielectric layer 6, a semiconductor layer 7, substantially identical to layer 5 is deposited. An upper layer 8 comprising a conductor 8 completes the memory cell.

As it has been disclosed in above mentioned U.S. Pat. No. 5,363,329, commutation effects in the patented memory elements are strongly dependent on the polarity of an applied external electrode voltage; that is, switching from the OFF to the ON state is carried out only at a certain polarity of the applied voltage. To switch the memory elements from the ON to the OFF state, it is necessary to reverse the polarity of the applied electrode voltage. This testifies to the fact that by a certain processing sequence, the dipole layer is created with a predetermined polarization vector in the active region of these previously created memory elements.

In accordance with the principles of my earlier invention, a dipole layer with a predetermined polarization vector is generated along an inter-electrode current path of memory elements having zones with a non-uniform concentration of additives, (donors and acceptors); and these zones are separated by a narrow active region (i.e., the memory layer). In my earlier invention it was preferable to use one interface of chalcogenide films Te—SnTe and Te—GeTe as the memory layer. Using one interface of chalcogenide films has significantly improved the basic electrical parameters of the memory cells. For example, the threshold voltage $U_{th1}$ and $U_{th2}$ has significantly decreased, and the number of switching cycles $N_{sw}$ has increased. However, the documented thin film structures in the U.S. Pat. No. 5,363,329 U.S. patent are stable only in the high resistance OFF state. In the low resistance conducting or ON state, these memory elements are insufficiently stable. As indicated above, this is due to the high concentration of free carriers, a significant increase of which follows the transition from the OFF to the ON state.

In accordance with the present invention, it is preferable to use the two interfaces of chalcogenide films, Te—SnTe and Te—GeTe, as memory layers. An embodiment of the present invention is shown in FIG. 11 which represents a cross-sectional view of a four (or three) terminal memory device structure.

Example 1

Figure 11:
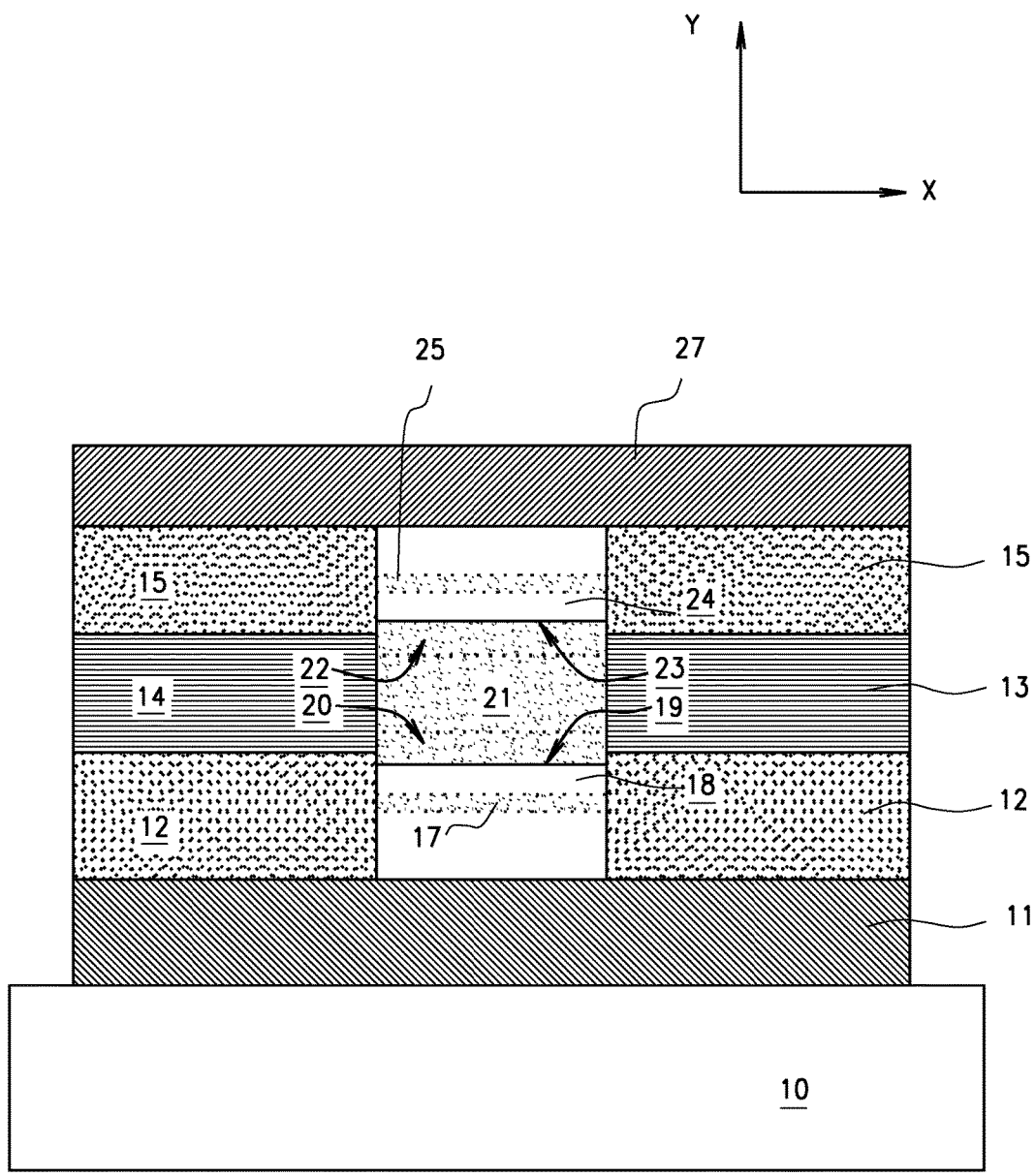
FIG. 11 represents an enlarged cross-section of an embodiment of the present invention.

As shown in FIG. 11, the memory device is formed on an insulator layer 10 which may or may not be a semiconductor substrate. The structure includes an insulator substrate 10, a lower electrode 11 that includes a conductive layer formed from Molybdenum (Mo), a lower $Si_3N_4$ insulating layer 12, an offset electrode 13 (or electrodes 13, 14) that includes a conductive layer (or layers) formed from Aluminum (Al), an upper $Si_3N_4$ insulating layer 15, a chalcogenide memory material contained in the pore region of the device, and an upper electrode 27 that includes a conductive layer formed from Molybdenum (Mo). The chalcogenide memory material has a stacked structure in which a Tellurium layer (central area) having an appropriate concentration of electrically active donor impurities is placed between two memory layers (lower 19 and upper 23). In the embodiment of FIG. 11, the two interfaces of chalcogenide films, Te—SnTe or Te—GeTe, are used as memory layers 19 and 23 respectively.

The central area (Tellurium layer) has a stacked structure including an ion source layer 21, and two layers 20 and 22 having a non-constant or varying concentration profile for additives (i.e., donor impurities). The layer 21 with a high concentration of the mobile positive charged ions is a source of electrically active donor impurities (Aluminum (Al), Antimony (Sb), Indium (In), Gallium (Ga), Copper (Cu) and other) migrating in layers 20 and 22. These donor impurities are necessary, as previously noted, for creating active (memory) layers at the interfaces of the Te—SnTe or Te—GeTe films. The content of donor impurities (for example Al) in ion source layer 21 is preferably on the order of approximately 25±10 percent by atomic weight. These impurities should be electrically active.

As previously discussed, the modification technique of the present invention is based on the increase in activity of lattice defects in Te films in the course of interaction with defect's additives as they become "electrically" active. To increase the activity of lattice defects in Tellurium thin films and Tellurium alloys (SnTe or GeTe), the films are prepared by depositing partially ionized vapor in a phased sequence from different sources; for example, effusion Knudsen cells and electron guns in a vacuum of $2 \times 10^{-4}$ Pa. The thickness of the Tellurium films 19, 23 is in range 45.0-50.0 nm. The thickness of intermediate ion source layer 21 with donor impurities is in the range of 30.0-40.0 nm. Ion source layer 21 is important for the creation of two dipole layers consisting of interacting dipoles on the interface of films, Te—SnTe or Te—GeTe. These dipole layers are created by a Coloumb interaction of negatively charged impurities in the SnTe, or GeTe, film with positively charged donor impurities in the Tellurium film. In the embodiment of FIG. 11, two layers 18, 24 of the chalcogenide alloy SnTe, or GeTe, are combined with Sn and Te in a ratio of approximately 1:1. Thin layers of dielectric 17, 25 are fitted between the memory layers 19, 23, and bottom 11, or the upper electrodes 27. The thickness of chalcogenide alloys 18, 24 and dielectric layers 17, 25 are not greater than 4.0-5.0 nm. The dielectric layers 17 and 25 are used as additives (i.e., the sources of negatively charged impurities) in both the chalcogenide alloys 18 and 24. The layers of chalcogenide alloys 18, 24 containing negatively charged impurities (ions of Oxygen or Fluorine) are necessary for the creation of two dipole layers consisting of interacting dipoles on the two interfaces of the Te—SnTe or Te—GeTe (19, 23).

Each of these two dipole layers has its own polarization vector. These vectors are oppositely directed and therefore the simultaneous presence of two dipole layers in the active material at a distance $L \leq L_D$ (where $L_D$ is Debye length) destabilizes the high resistance OFF state of the memory cell. To prevent the chalcogenide material of the device from the negative effect, a preferred processing sequence is employed. First, a lower active dipole layer 19 that is closer to the bottom electrode is formed. Then, an upper active region 23 located near the upper electrode is formed. The polarization field of the lower active region (dipole layer) 19 temporarily blocks the creation of the upper dipole layer 23. This provides not only stability in impedance in the high resistance OFF state, but also creates the conditions necessary for reliably stable memory cell functioning.

The memory device illustrated in FIG. 11 is a simple non-volatile logical element or non-volatile trigger that operates as follows:

Switching of the memory cell to its low resistance ON state is possible when a pulse of negative voltage is applied to the offset electrode 14 (FIG. 11) contacting an ion source layer 21 and upper electrode 27. When a pulse of negative voltage is applied to the offset electrode 14 (see FIG. 12*a*) contacting an ion source layer 21, positively charged ions of an impurity (for example, Aluminum (Al)) are displaced from the defect states they occupy on the lower film's interface 19 and electromigrate or move toward the offset electrode 14. The resulting signal is applied between electrodes 14 and 11. Simultaneously, negatively charged ions of an impurity (for example, Fluorine (F)) are displaced from defect states they occupy on the lower film's interface 19 and electromigrate or move toward the electrode 11.

Figure 12A:
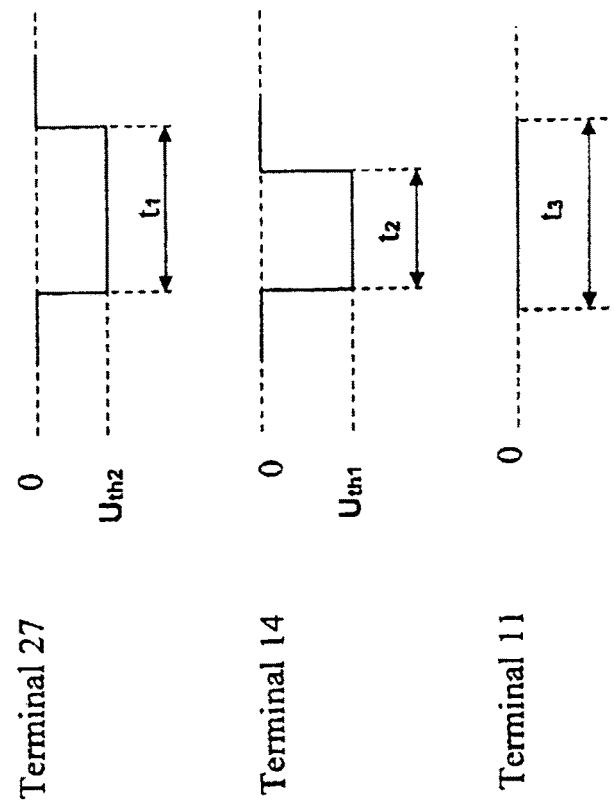
FIGS. 12a and 12b are waveform charts of the voltages applied at the time of switching from one state to another.

When the threshold voltage is $U_{th1}=2$ Volts, a phase transition into a new metastable state (a metastable superstructure with remanent internal polarization) with high conductivity takes place at the weakest point of the lower film's interface 19. Simultaneously, a pulse of negative voltage and correspondent amplitude ($U_{th2}=1$ Volts) and duration is applied to upper electrode 27 (FIG. 12*a*). This signal is applied between electrodes 27 and 11 which have contact with the stacked chalcogenide material. The result is that following switching of lower memory layer 19 of the memory device into its conductive ON state, upper memory layer 23 of the memory device immediately switches to its high resistance OFF state.

After switching the memory device into the low resistance ON state, the metastable state of lower memory layer 19 is held by at least two stable internal electric fields:

1) oppositely directed stable field of the ferroelectric phase induced in the nearest to it zone, chalgogenide alloy 18 (Field 1);
2) oppositely directed stable field of the dipole phase (Field 2) created at the time of upper memory layer 23 switching to a high resistance OFF state;
3) oppositely directed, but unstable internal field of piezoelectric polarization induced at the lower "filament" conduction interface with nearest to it chalcogenide layer. The emergence of this field is conditioned by the misfit crystal lattice parameters of the grids created at the "filament" conduction interface with nearest to it chalcogenide layers.

The total excessiveness of these fields as related to the remanent polarization field is offset by:

4) an interlayer polarization internal field.

Out of these four fields, the interlayer and piezoelectric fields are least stable as they are very sensitive to fluctuations in the concentrations of highly mobile impurity ions migrating to chalcogenide layers. The main role of these fields is to establish a balance within in the thin film structure after switching from the OFF state to the ON state.

Ferroelectric phase stability on zone 18 of the memory layer switched in conductive low resistance ON state can be described as being almost fully absent of free carriers, the majority of which are localized near memory layer 23.

This provides a cell that has improved stability in magnitude of conductivity in the low resistance ON state during set/reset cycling.

Figure 12B:
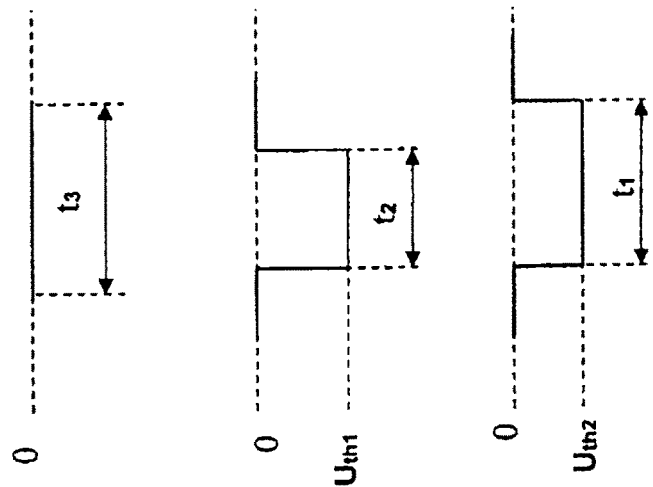

Switching of the memory cell to its high resistance OFF state is possible when a pulse of negative voltage is applied between offset electrode 14 (FIG. 11) contacting ion source layer 21 and upper electrode 27. When the threshold voltage is $U_{th1}=2$ Volts, a phase transition into a new metastable state (a metastable superstructure having remanent polarization) with high conductivity takes place at the weakest point of the upper film's interface 23. Simultaneously, a pulse of negative voltage correspondent amplitude ($U_{th2}=1$ Volts) and duration is applied to bottom electrode 11 (FIG. 12*b*). This signal is applied between upper and bottom electrodes 27 and 11 that have contact with the stacked chalcogenide material. The result of this operation is that after the switching upper memory layer 23 of the memory device into its low resistance ON state, lower memory layer 19 of the device immediately switches to a high resistance OFF state. After switching the memory device into its high resistance OFF state, the metastable state of upper memory layer 23 is also held by at least two stable internal electric fields:

1) an oppositely directed stable field of the ferroelectric phase induced in the nearest zone—chalcogenide alloy 24 (Field 3);
2) an oppositely directed stable field of the dipole phase (Field 4) created when lower memory layer 19 switches to its high resistance OFF state;
3) an oppositely directed but unstable internal field of piezoelectric polarization induced at the upper "filament" conduction interface with the nearest chalcogenide layer.

Availability of the electric fields in Te film and ferroelectric phase, as induced in chalcogenide alloy 24, partially compensates for the influence of the remnant polarization $P_2$ of upper memory layer 23 at the threshold voltage $U_{th.1}$ in lower memory layer 19. Settling of the total balance of these internal fields, after switching the memory cell to its high resistance OFF state, stabilizes the $U_{th.1}$ value. Moreover, the change of polarity of the applied voltage on the electrodes leads re-establishes the $U_{th.1}$ value of the memory cell.

The significant and advantageous result of this is a cell having improved impedance stability in the high resistance OFF state during cycling between the set and reset states. It is also important to note that the resistance of the memory cell of the invention in its low resistance ON state is ~10 kOhm. The duration of the pulses which switch the memory cell between its ON and OFF states is typically no greater than 50 ns. The number of switching cycles during which changes in the threshold voltages ($U_{th1}$ and $U_{th2}$) of the memory cell occur are no more than 10% greater than $10^{16}$. Data storage time is not limited.

The further advantageous result of this is that the duration of the pulses which switch memory cell from one state to the other, the data storage time, and the threshold value stability of the memory cell of the present invention considerably exceeds that of prior art memory cells.

Examples 2 and 3

In these examples, devices having an asymmetric design were fabricated according to the technological process described with respect to Example 1 hereinabove. In the asymmetric design, upper insulating layer 15 and lower insulating layer 12 were of different thicknesses. More specifically, thicknesses of the insulating layers 12 and 15 are such that the offset electrodes 13 and 14 are located in closer spatial proximity to lower memory layer 19 than to upper memory layer 23. The asymmetric placement of electrodes 13 and 14 facilitates the creation of memory cells with effects such as interfacial superconductivity and interfacial magnetization (a current modulation of nonequilibrium magnetization or spin transistor effect) in semiconducting chalcogenide superlattices occurring at room temperature.

Example 2

Spin-Orbitrons

In this example, a layer 21 of Tellurium with a high concentration of mobile positively charged ions is the source of electrically active donor impurities such as the rare earth element Yttrium (Y) and Copper (Cu), or impurities such as iron (Fe) migrating into layers 20 and 22. The amount of the two donor impurities (e.g., Y and Cu) in ion source layer 21 is preferably on the order of approximately 25±10 percent by atomic weight. The content of Copper in the layer 21 is preferably on the order of 4±5 percent by atomic weight. The dielectric layers 17, 25 are used as additives or as the sources of negatively charged impurities in both chalcogenide alloys 18, 24. The thickness of dielectric layers 17, 25 are in the range of 20.0-40.0 nm. The layers 17, 25 of dielectric containing Oxygen and Cuprum (CuO) or Oxygen, Cuprum and Barium ($BaCuO_2$) or even more complex dielectrics, e.g., Lead, Magnesium, Oxygen, Cuprum and Barium $\{(Pb_2Mg_2)Ba_2Cu_9O_{15}\}$ are necessary for the creation of two dipole layers consisting of interacting dipoles on the interface of films Te—SnTe or Te—GeTe. Dielectric layer 17 is used as an additive or source of negatively charged impurities) in the chalcogenide alloy 18. The dielectric layer 25 is used as an additive (or as the sources of negatively charged impurities) in chalcogenide alloy 24. The presence of an additional dipole layer in the interface 23 serves as a stabilizing factor for creating the layer responsible for the superconductive (memory) effect at room temperature. In this example, an offset electrode 13, or electrodes 13 and 14, includes a conductive layer (or layers) formed from Tin (Sn), Lead (Pb), Gold (Au) or Aluminum (Al).

In this example, all resistance measurements were performed after the switching the device to its conductive ON state, this being done in a manner similar to that described in Example 1.

Resistance measurements between electrodes 13, 14, for a current of 500 μA, were carried out in the temperature range of 2.5-300° K. using a two-probe technique involving a standard He cryostat equipped with a magnet. Orientation of the cell in the magnetic field was changed with the help of a rotation mechanism. The critical magnetic fields were defined from the resistive transitions by the criteria $R=0.5R_n$.

After switching the device into its highly conductive ON state, the resistance $R_{ON}$ between electrodes 13 and 14 was measured in the range of $R_{ON}\approx9.15$-9.58 Ohms at room temperature (300° K.) and $R_{ON}\approx0$ Ohm at T≤3.7° K. The anisotropy of the upper critical magnetic field was very large. The upper critical magnetic field $H_{c2}\perp$ for a perpendicular orientation exceeded, by approximately ten times, $H_{c2}\|$ for parallel orientation of the magnetic field. The resistance in the parallel and perpendicular magnetic fields was also quite anisotropic. The inventor supposes that, after switching the memory cell to its highly conductive ON state, the contacts' resistance $R_{SN}$ (for electrodes made from Sn), and the resistance at the film's edges where the filament of conductivity is created is 0 Ohms. This means that the resistance between offset electrodes 13 and 14 of memory cells in their ON state is fully absent at room temperature.

Based on the above and other research that has been performed, the inventor has concluded that the implementation of interfacial superconductivity in semiconducting chalcogenide superlattices at room temperature is feasible.

Example 3

This example is directed at a variant of a spin transistor (spin FET or spintrons) for use in the electronics field of spin electronics.

Here, a device having an asymmetric design was fabricated according to the technological process previously described in Example 1.

In this example, a layer 21 of Tellurium with a high concentration of mobile positive charged ions is the source of such electrically active donor impurities as the rare earth element Lanthanum (La) and Manganese (Mn) migrating in layers 20 and 22. The amount of these two donor impurities in ion source layer 21 is preferably on the order of approximately 25±10%. The content of Manganese in layer 21 is preferably between approximately 5-6%. The dielectric layers 17, 25 are used as an additive (i.e., sources of negatively charged impurities) in both chalcogenide alloys 18, 24. The thickness of the dielectric layers 17, 25 is in the range of 20.0-30.0 nm. The layers 17, 25 of dielectric containing Oxygen and Manganese (MnO) are necessary for the creation of two dipole layers 19, 23 consisting of interacting dipoles on the interface of films Te—SnTe or Te—GeTe.

In this example, an offset electrode 13, or electrodes 13 and 14, includes a conductive layer (or layers) formed from a ferromagnetic material such as a Fe—Ni alloy which is magnetized in the X direction as shown in FIG. 11. In this example, all current and magneto-resistance measurements were taken after switching the device to its conductive ON state. Again, switching to the conductive ON state was carried out in a manner previously described with respect to Example 1.

After switching the cell to its ON state, current measurements were taken between electrodes 13, 14 for the application of different voltages on upper electrode 27. A constant voltage in the range of 15-50 mV was applied between electrodes 13 and 14. Subsequently, a variable negative potential in the range of 0-550 mV was applied to upper electrode 27. This signal was applied between the upper and bottom electrodes 27 and 11 having contact with the stacked chalcogenide material. The result was observation of current modulation in the cell structure.

One conclusion from this is that upper electrode 27 operates, analogously, as the gate in a CMOS transistor. Further, current modulation arises from spin precession due to the spin-orbit coupling in the hetero-structure interface of chalcogenide films; while, magnetized contacts are used to preferentially inject and detect specific spin orientations. The spin-orbit coupling (SOC) is proportional to the expectation value of the electric field at the hetero-structure's interface with chalcogenide films and can be controlled by the application of a gate voltage. In this example, the testing has demonstrated that spin current polarization can be up to ~50%. The magneto-resistance in parallel and perpendicular magnetic fields is quite anisotropic. At the magnitude of the perpendicular magnetic field of $H\perp=11\text{-}12$ Oe, resonance of the magneto-resistance was observed.

Also, it is important to note that after switching the device to its conductive ON state, the resistance $R_{ON}$ between electrodes 13 and 14 was in a range 0.9-1.2 kOhm at room temperature (300° K.). Therefore, although further work in this area may be needed, implementation of the spin current polarization in the hetero-structure interface of chalcogenide films is feasible at room temperature.

Next, in another embodiment, the memory device includes four terminals in electrical contact with the chalcogenide layers so to achieve interfacial super-conductance and magneto-resistance effects in semiconducting chalcogenide superlattices. Here, one can use rare chemical elements such as Y (Yttrium) and La (Lanthanum) as electrically active impurities (or additives) in the Te films. At that, as oxides in SnTe or GeTe alloys, one can use CuO (or $BaCuO_2$) and MnO, accordingly. To achieve spin and super-conductivity effects at ambient temperature at the interfaces of chalcogenide films, it is also possible to use other chemical elements and related oxides as well.

Key Findings

On the basis of the proposed phenomenological model, it can be concluded that:

1) The nature of the observed switching effects in strong electric fields is caused by similar processes of structural transformations taking place in Tellurium films due to the presence of electrically active impurities on structural defects. Depending on the type of prevalent defects in Te films, one can observe either a memory effect or a threshold switching effect. The memory effect is observed in Te films, in which breakage of covalent bonds are prevalent, and the threshold switching effect is characteristic for Te films with defects in the formation of which single electron pairs take an active part. The memory effect with a high conductivity follows the effect of switching elements to this high-conductive state. The physical nature of such a switching effect is directly related to the formation of a dipole phase on the structural defects of chalcogenide semiconductors. Donor-acceptor impurities directly participate in the formation of dipoles on structural defects. The number of defects and related donor-acceptor impurities in the active elements' region should be sufficient ($N_{def} \geq 3 \times 10^{18}$ cm$^{-3}$) to create the necessary conditions for cooperative dipole-dipole interaction. Such a huge amount of defects is typical for amorphous structures, surface states, or films' interfaces ($N_{ss} \geq 10^{13\text{-}14}$ cm$^{-2}$).

2) Certain polarity, amplitude (threshold) and duration of an applied external voltage causes electromigration of some ions of impurities, these having taken part in the formation of a dipole layer beforehand. Electromigration of impurities' ions leads to structural transformations both in the active region and in surrounding Te film's layers. As a result, the stable state of an active region, for which quasidielectric conductivity is a characteristic, transforms into a metastable state with a quasimetal type of conductivity.

3) The structural transformations connected with the change in impurities' charge occurred in both the active region and in the surrounding Te films' layers. The change in impurities' charge leads to various effects at the edge of the filament of conductivity with neighboring layers of chalcogenide semiconductors. If defects of covalence bonds are prevailing in neighboring chalcogenide layers; then, interaction with impurities having shorter (rigid) resonance bonds will occur. In case of van der Waals bonds' defects, changed impurities' charge leads to the creation of anti-bonding (or weakly-bonding) molecular orbitals with the result that one can observe either the memory effect or threshold switching effect.

4) After switching thin film elements to their ON state (in a metastable state with a quasimetal type of conductivity), remanent internal polarization with a strictly forwarded polarization vector $P_{ins}$ is preserved. For memory elements, during switching of an external voltage, the metastable state is maintained by an oppositely directed vector of induced internal polarization phase ($P_{ind}$) in surrounding layers. For threshold switching elements, because of the absence of necessary stabilizing polarization, a metastable state with a quasimetal type of conductivity can persist only by application of an external electric field $U \geq U_h$.

5) Quasimetallic behavior of the ON state is provided by the effect of band inversion in the superlattice "filament" of conductivity, and the creation of inversion layers where the metallic type of the conductivity is present. Resistance in the ON state is conditioned by the peculiarity of spin-orbit coupling (SOC) on the band inversion points of the two different waves of electron densities. Characteristics of the resulting wave formed on the inversion points in the "filament" of conductivity are defined by the type of ions created in the 2D-equatorial plane.

6) The spatial inversion of the "memory filament" decreases strength of the spin-orbit coupling (SOC) in the Dirac metallic phase state due to reversing the polarization direction in the ferroelectric order in neighbor SnTe or GeTe alloy. If it is possible to reach un-screening effects in three-dimensional topological system, i.e. in the "memory filament", that the decreasing SOC can create a real condition for the Dirac electrons helical-Cooper pairing in such system. It is a necessary or even decisive condition for the achievement of super-conductance and magneto-resistance effects at the ambient temperature in some layered chalcogenide structures.

7) The dependence of switching effects on the polarity of the applied external electric field, as experimentally observed, is defined by the result of the technological stages of M1-Te1-O(T)-Te2-Al thin film production (where, M1-Ni, Au, Cr; O(T)-Te oxide; Al-Aluminum). The result of these operations defines the specificity of formation dipole regions having an internal electric field with a specific orientation (i.e., direction) in complex chalcogenide semi-conductors.

The following is based on the above outlined results, and should be in the production process of thin-film memory and switching cells:

the threshold switching and memory effects should be observed in such multi-component chalcogenide compounds, which, besides "acceptor" impurities (e.g., Oxygen, Fluorine atoms or their compounds), also include "donor" impurities (usually metals of variable valence). These materials include primarily, but not exclusively, the elements of the group: B (Z=5), Al (Z=13), Ga (Z=31), In (Z=49), Tl (Z=81), where Z is the atomic number in the Periodic Table of the Elements. A number of d- and f-transition metal elements can also be used for this purpose.

when manufacturing memory cells, single-component chalcogenide semiconductors and multi-component chalcogenide semiconductor compounds should be used, both of which should have a large amount ($N_{def} \geq 10^{18-20}$ cm$^{-3}$) of electrically active defects with broken covalent bonds. Such a large number of defects with broken covalent bonds is possessed by Tellurium films deposited as $V_2 \geq 8.0$-$10.0$ nm/c and d≥50 nm, and two-tetrahedral compounds such as: $SnTe_x$ and $GeTe_x$ ($x \geq 0.75$). During the electro-migration of impurities, under the influence of the external voltage of Te films deposited as $V_2 = 10.0$ nm/c and in $SnTe_x$ and $GeTe_x$ compounds, the ferroelectric phase necessary for memory effect implementation can be artificially induced. Since switching from the OFF to ON state for memory elements is directly related to the transition from a cubic structure to a C6 type structure, these effects are particularly pronounced at the interface of multilayer structures such as: SnTe—Te or GeTe—Te. Moreover, at the interfaces of the films SnTe—Te or GeTe—Te there must be a necessary amount of defects ($N_{ss} \geq 10^{13-14}$ cm$^{-2}$) for the implementation of switching effects to the low resistance ON state and memory in order to maintain this state.

when manufacturing of threshold switch cells, single-component chalcogenide semiconductors and multi-component semiconductor compounds should be used. Both of these should be dominated by defects with impaired Van der Waals bonds. The defects with impaired Van der Waals bonds are possessed by both Tellurium films deposited at $V_1 = 2.0$-$3.0$ nm/c and d≤50 nm and amorphous Tellurium Arsenide compounds such as $As_{1-x}Te_x$, or Selenium Arsenide compounds such as $As_{1-x}Se_x$ ($0.40 \leq x \leq 0.55$), with minor additions of Silicon (Si) and Germanium (Ge). It is known that the Si and Ge additives lead to distortions of AsTe and AsSe tetrahedral structures, and that in such materials the relatively stable ferroelectric phase is not induced. Commutation (switching) effects are particularly pronounced in amorphous chalcogenide semiconductors of STAG type, or at the interface of multilayer structures $As_{1-x}Te_x$—Te, or $As_{1-x}Se_x$—Te. At the interface of these films, there is a sufficient number of structural defects ($N_{ss} \geq 10^{13-14}$ cm$^{-2}$) such as are necessary for the implementation of the switching effect.

to achieve interfacial superconductive and spin effects in semiconducting chalcogenide superlattices, one should primarily, but not exclusively, use such rare chemical elements as Yttrium (Y) and Lanthanum (La) as electrically active impurities (or additives) into Te films. Other chemical elements which can be used include, for example Fe. In addition, as oxides in SnTe or GeTe alloys, one should use CuO (or $BaCuO_2$) and MnO, accordingly. Those skilled in the art will understand that other oxides may be used for this purpose.

Due to the presence of the dipole phase in the active layer, for the switching effects in thin chalcogenide films, the polarity of the applied voltage needs to be taken into account. This is achieved by using a specific sequence of processing steps (technological operations) in the manufacturing process of the memory elements. Specifically, zones with non-constant (variable) concentration profiles of additives (i.e., donors and acceptors) should be located along an inter-electrode current path through a memory element. These zones should be separated by an active region in the memory layer.

In U.S. Pat. No. 5,363,329, an interface of chalcogenide films Te—SnTe and Te—GeTe was used as the switching layer. In this patent, metastable states formation at the interface of chalcogenide films is described, this mechanism being based on the structural transformations taking place at the interface of chalcogenide films due to reverse migration processes caused by an external electric field.

The film interface of Tellurium (Te) and Tin Tellurium (SnTe), or Tellurium (Te) and Germanium Tellurium (GeTe), exhibit a gradual transition from a hexagonal to a cubic structure. As a result of mutual diffusion processes and the mixing of the basic components, the interface of Te—SnTe and Te—GeTe films comprises interchanging layers of variable composition of SnTe (or $GeTe_x$), where a gradual transformation from hexagonal to cubic structure takes place. Some layers of variable substance $SnTe_x$ or $GeTe_x$ ($x \geq 0.75$) can be characterized by the availability of many vacancies, or structural defects, which are created with the assistance of broken (non-saturated) covalence bonds. In case of the availability of a certain concentration of electrically active impurities on these defects, a tetragonal structure is created which is caused by the cooperative interrelation of dipoles. Under the influence of an external electric field, a reverse transformation of tetragonal structure to the metastable structure $MeTe_2$-type (where, $Me_2^+$ is metal's ion) takes place. This is the "active", or switching region of a memory element. At the same time there is temporal stabilization, or a preserving of the created metastable structure $MeTe_2$ in surrounding active region of thin film layers Te and $SnTe_x$, or $GeTe_x$ ($x \geq 0.65$), with the presence of internal electric fields induced because of the electrically active impurities. The result is that in these layers, due to the influence of internal and external electric fields. a polarized phase is created artificially.

As indicated, for example, in U.S. Pat. No. 8,363,463 B2, the source of various electrically active impurities for such memory layers can be oxides. For instance, in the case of addition (i.e., sputtering) of an oxide such as $MgF_2$ to a $SnTe_2$, a thin layer is formed at the film's interface, and an isomorphic (aliovalent) filling of vacancies takes place, as follows:

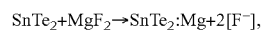

$$SnTe_2 + MgF_2 \rightarrow SnTe_2:Mg + 2[F^-],$$

Where [F$^-$] is an F$^-$ ion embedded in the space between nodes. Since the radii of Mg$^{2+}$ and Sn$^{4+}$ ions are similar, Magnesium ions will fill the cationic vacancies and "rebuild" the $SnTe_2$ defect structure until it is substantially cubical. Fluorine ions lodge in the space between nodes and act to fill valence possibilities as much as possible. As a result, weak resonance bonds are created which leads to the mobility of Fluorine ions. The high mobility of Fluorine ions leads, in turn, to the absence of fixed dipole moments in these complexes at ambient temperature. Also, a high concentration of Fluorine ions in a certain layer (zone) of a $SnTe_x$ chalcogenide complex creates the region of spatial negative charge necessary to attract migrating positively charged impurities (typically metallic ions) from a neighboring thin film Tellurium layer. And, moreover, a layer with a high concentration of high mobility charged ions acts as a source or supplier of the electrically active impurities necessary for the formation of an "active" switching layer.

Chaotic shifts of Fluorine ions cannot cause significant distortions of the symmetrical field in an ideal cubical lattice in $SnTe_2$:Mg. This is why, under normal conditions, spontaneous polarization in such complex compounds is absent. At has been previously noted, to create an internal spontaneous polarization, a change of the charge state of the impurities' needs to place in the defect structural formation $Al^{IV}B^{VI}$.

As it has been previously noticed, a change of the charge state of certain impurities in $A^{IV}B^{VI}$ creates Jan-Teller local structural instability of $A^{IV}B^{VI}$ complexes due to anharmonicity of cubical potentials. It can be supposed that changes in the charge state of impurities probably occurs under the influence of strong internal piezoelectric and external electric fields. Creation of a strong internal piezoelectric field is connected both with piezoelectric polarization created at the edge of the filament's splitting with surrounding chalcogenide layers and in the result of strong spin-orbit coupling (SOC). For instance, in case of Te film creation, such a field is conditioned by the misfit of crystal lattice parameters of the two grids appearing at the interface of the filament of conductivity with the neighboring Te film. The grid parameters of a Te film are connected to the concentration of impurities electromigrating to this Te film under the influence of an external electric voltage.

Meanwhile, creation of strong internal field can be connected with the appearance of strong spin-orbit coupling (SOC) which is induced with phase transition of a normal isolator into crystalline 3D-topological isolator, i.e. "filament" of conductivity.

So, in order to change the charge of impurities, anharmonicity of the crystal potential of cubical grid of $SnTe_2$:Mg is created. Orientation of the external electric field determine the anharmonicity priority of a crystal's potential in a distorted elementary cubical cell, i.e., the direction of rhombohedral distortion. At the same time, changes in the impurities charge promote decreasing lengths of resonance bonds which tend to become shorter and more rigid. This then leads to the strict fixation of separate negatively charged Fluorine ions in a distorted cubical cell of $SnTe_2$:Mg cell and, consequently, to fixation ("freezing") of separate dipole moments in the direction of the external electric field. At a critical concentration of fixed dipoles, cooperative ordering and accumulation of dipole moments takes place, which induces powerful internal polarization, $P_{ind}$. As a result of cooperative structural transformations, at ambient temperature, a transformation in the polarization phase (analogical to ferroelectric phase transformation which is displacive in nature) takes place in a complex chemical compound such as $SnTe_2$:Mg$^+$[F$^-$].

Powerful electric fields not only produce threshold switching effects, but also induce internal fields in complex chalcogenide compounds as well. Internal electrical fields (with $P_{ind.} \geq P_{ins.}$) are necessary for storage state having low resistance. This low-resistance state is one of two basic states (i.e., ON and OFF) of memory elements. However, as has been found, polarized phases in Te films and in $SnTe_x$ or $GeTe_x$ complex compounds with various impurities are not stable enough due to a high concentration of free carriers in the low resistance ON state. As described hereinabove, the present invention solves this problem.

CONCLUSIONS

Different embodiments of the present invention have been described hereinabove each of which represents a layered structure with the two memory layers formed on an interface of two regions as the result of the mutual mixing and migration of their constituents. One of the regions contains an electrically active donor impurity. A thin layer of dielectric is placed in the other region. This dielectric layer is used as an additive (a source of negatively charged impurities) in the chalcogenide alloys. The layers of chalcogenide alloys containing negatively and positively charged impurities are necessary for the creation of two dipole layers consisting of interacting dipoles on the interface of Te—SnTe or Te—GeTe films. The memory layer is a multi-component chalcogenide semiconductor based tellurium which, keeping to the certain internal and external conditions, creates and keeps a metastable superlattice with the remanent polarization $P_{ins}$.

Internal conditions within the semiconductor include the concentration of electrically active impurities in the memory layers. Then, the polarity, amplitude and duration of an applied external voltage cause a reduction in the concentration of the electrically active impurities in the first memory layer. This results in switching of the memory device of the invention to a state having a metastable superlattice, which condition is due to the redistribution of the electron density on the metal ions (cationic elements) of different valence and which, in turn, a creates charge-regulating system of Tellurium ions $Te_1^{1-}$ and metal ions $Me^{2+}$ ($MeTe_2$) in the 2D equatorial plane together with system of Tellurium ions $Te_1^{1-}$ overlying the 2D-plane. This metastable superlattice with a quasi-metallic type of conductivity takes place at the weakest point of the first films interface. Quasi-metallic behavior of the conductive "filament" is results from the band inversion in the superlattice "filament" of conductivity and the creation of inversion layers where the metallic type of the conductivity is present. Resistance in the ON state is conditioned by the peculiarity of the spin-orbit coupling on the band inversion points of the two different waves of electron densities. Characteristics of the wave imposed at the inversion points in the "filament" of conductivity are defined by the type of ions creating the 2D-equatorial plane.

At the same time, under the direct influence of the external voltage $U \geq U_h$ into the neighbor chalcogenide semiconductor alloys in the memory cell, stable internal polarization $F_{ind}$, is induced to hold or fix the metastable superstructure (memory effect) if the external voltage is removed. This memory effect is achieved when $P_{ind.} \geq P_{ins}$.

Using the method of production of the invention and the resulting proposed technical solutions, it is now possible to produce not only simple memory elements with improved parameters, but also to achieve spin and superconductive effects in film interfaces at ambient temperature as well. This significantly expands unique opportunities of chalcogenide semiconductors.

In view of the above, it will be seen that the several objects and advantages of the present disclosure have been achieved and other advantageous results have been obtained.

Having thus described the invention, what is claimed and desired to be secured by Letters Patent is:

1. An electrically alterable memory device or non-volatile trigger, comprising:
a plurality of electrodes in electrical communication with a stacked chalcogenide material, said stacked chalcogenide material including a lower memory cell and an upper memory cell and a central area located between said lower memory cell and said upper memory cell;
wherein each of said upper and lower memory cells includes a chalcogenide alloy and an interface between said central area and said chalcogenide alloy and represents a layered structure with a memory layer that is formed on the respective interface between said central area and each of said chalcogenide alloys;

wherein each said chalcogenide alloy includes an intermediate thin film layer of a dielectric interposed therebetween, said thin film layer of said dielectric used as a source of negatively charged impurities in said chalcogenide alloy;

wherein said central area comprises a chalcogenide-metal ion material including an ion source layer and lower and upper Tellurium layers having varying concentration profiles of additives composed of positively charged impurities;

wherein each of said memory layers is formed on said interface as a result of mutual diffusion and mixing of constituents;

wherein said plurality of electrodes include a first electrode, a second electrode, and two offset electrodes, said first electrode positioned beneath and electrically coupled to said chalcogenide alloy of said lower memory cell, said second electrode positioned above and electrically coupled to said chalcogenide alloy of said upper memory cell, and said two offset electrodes interposed between said first and said second electrodes and electrically coupled to said ion source layer of said central area.

2. The memory device according to claim 1, wherein said central area comprises said chalcogenide-metal ion material including said ion source layer and said lower and upper Tellurium layers having varying concentration profiles of additives, each Tellurium layer being formed of a Tellurium based material.

3. The memory device according to claim 2, wherein said ion source layer is formed of said Tellurium based material and further includes donor impurities selected from a group including Al, Cu, Y, Yb, Fe, La and Mn.

4. The memory device according to claim 3, wherein the donor impurities concentration in said ion source layer is approximately 25±10 percent by atomic weight.

5. The memory device according to claim 2, wherein said lower Tellurium layer and upper Tellurium layer are both ionic-conduction materials and in which migration channels for positively charged donor impurities are formed.

6. The memory device according to claim 1, wherein said chalcogenide alloy of the lower memory cell and said chalcogenide alloy of the upper memory cell both are selected from and comprised of $GeTe_x$ and $SnTe_x$, and mixtures or alloys thereof.

7. The memory device according to claim 6, wherein said chalcogenide alloy of the lower memory cell and said chalcogenide alloy of the upper memory cell both are formed of a chalcogenide alloy including $GeTe_x$ and $SnTe_x$ with said intermediate thin film layer of dielectric interposed therebetween.

8. The memory device according to claim 7, wherein said layers of dielectric contain at least one fluoride or oxide selected from a group comprising $MgF_x$, $MgO_x$, $AlO_x$, $CuO_x$, $BaCuO_x$, $MnO_x$, and which is incorporated into the chalcogenide alloy comprised of $GeTe_x$ and $SnTe_x$, and mixtures or alloys thereof.

9. The memory device according to claim 8, wherein the chalcogenide alloys comprised of $GeTe_x$ and $SnTe_x$, and mixtures or alloys thereof, incorporate said fluoride or oxide selected from said group comprising $MgF_x$, $MgO_x$, $AlO_x$, $CuO_x$, $BaCuO_x$, $MnO_x$ for use as a source of negatively charged impurities including Fluorine ions or Oxygen ions.

10. The memory device according to claim 9, wherein a concentration of a Fluorine ion or an Oxygen ion in said chalcogenide alloys comprised of $GeTe_x$ and $SnTe_x$, and mixtures or alloys thereof, is approximately 25±10 percent by atomic weight.

11. The memory device according to claim 1, wherein an electric field is applied to provide a higher electrical resistance state (OFF) in said upper memory cell and a lower electrical resistance state (ON) in said lower memory cell, and vice versa, with switching from one electrical resistance operating state to another electrical resistance operating state occurs upon application to said plurality of electrodes of an electrical signal of an appropriate polarity, amplitude and duration, said electrical signal being applied between said offset electrodes and either of said first or second electrodes; and wherein after switching of said lower memory cell into its lower electrical resistance operating state (ON), said upper memory cell is switched immediately to its higher electrical resistance operating state (OFF), and vice versa.

12. The memory device according to claim 1, wherein the said two offset electrodes are formed of a metal selected from a group comprising Al, Sn, Au and Pb and are adjacent to said ion source layer; said two offset electrodes being symmetrically or asymmetrically disposed between said first and said second electrodes.

13. The memory device according to claim 1, wherein the said two offset electrodes are formed of a ferromagnetic material which includes a Fe—Ni alloy that is previously magnetized in a predetermined orientation and located adjacent to said ion source layer, and said two offset electrodes are asymmetrically disposed between said first and said second electrodes.

14. The memory device according to claim 12, further including forming a state between said two offset electrodes by switching of said lower memory cell into a low resistance, high conductive, operating state (ON), and simultaneously switching said upper memory cell to a high resistance operating state (OFF), said state which is formed being a super conductive state.

15. The memory device according to claim 13 further including forming a state between said two offset electrodes by switching of said lower memory cell to a high conductance state (ON), and simultaneously switching said upper memory cell to a high resistance state (OFF), said state which is formed being a magneto-resistive state.

* * * * *